United States Patent
Micks et al.

(10) Patent No.: US 10,228,693 B2
(45) Date of Patent: Mar. 12, 2019

(54) GENERATING SIMULATED SENSOR DATA FOR TRAINING AND VALIDATION OF DETECTION MODELS

(71) Applicant: Ford Global Technologies, LLC, Dearborn, MI (US)

(72) Inventors: Ashley Elizabeth Micks, Mountain View, CA (US); Sneha Kadetotad, Cupertino, CA (US); Jinesh J. Jain, Palo Alto, CA (US); Dongran Liu, San Jose, CA (US); Marcos Paul Gerardo Castro, Mountain View, CA (US); Vidya Nariyambut Murali, Sunnyvale, CA (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 42 days.

(21) Appl. No.: 15/406,031

(22) Filed: Jan. 13, 2017

(65) Prior Publication Data
US 2018/0203445 A1    Jul. 19, 2018

(51) Int. Cl.
*G05D 1/00* (2006.01)
*G06F 17/50* (2006.01)
*G06N 99/00* (2010.01)

(52) U.S. Cl.
CPC ....... *G05D 1/0088* (2013.01); *G06F 17/5009* (2013.01); *G06N 99/005* (2013.01)

(58) Field of Classification Search
None
See application file for complete search history.

(56) References Cited

U.S. PATENT DOCUMENTS

| | | | |
|---|---|---|---|
| 5,345,402 A | 9/1994 | Gioutsos | |
| 7,099,796 B2 | 8/2006 | Hamza | |
| 7,447,593 B2 | 11/2008 | Estkowski | |
| 7,579,942 B2 | 8/2009 | Kalik | |
| 7,839,292 B2 | 11/2010 | Wang | |
| 8,655,537 B2 | 2/2014 | Ferguson | |
| 9,098,753 B1 | 8/2015 | Agarwal | |
| 2015/0344028 A1* | 12/2015 | Gieseke | B60W 30/00 701/1 |
| 2017/0076019 A1 | 3/2017 | Nallapa | |
| 2017/0109928 A1 | 4/2017 | Mick | |
| 2017/0132334 A1 | 5/2017 | Levinson | |
| 2017/0148168 A1* | 5/2017 | Lindner | G06T 7/0075 |
| 2017/0213070 A1* | 7/2017 | Aghamohammadi | G06K 9/00201 |
| 2017/0262768 A1* | 9/2017 | Nowozin | G06N 99/005 |
| 2018/0098052 A1* | 4/2018 | Black | H04N 13/0275 |

\* cited by examiner

*Primary Examiner* — Rami Khatib
(74) *Attorney, Agent, or Firm* — David R. Stevens; Stevens Law Group

(57) ABSTRACT

A scenario is defined that including models of vehicles and a typical driving environment. A model of a subject vehicle is added to the scenario and sensor locations are defined on the subject vehicle. Perception of the scenario by sensors at the sensor locations is simulated to obtain simulated sensor outputs. The simulated sensor outputs are annotated to indicate the location of obstacles in the scenario. The annotated sensor outputs may then be used to validate a statistical model or to train a machine learning model. The simulates sensor outputs may be modeled with sufficient detail to include sensor noise or may include artificially added noise to simulate real world conditions.

13 Claims, 15 Drawing Sheets

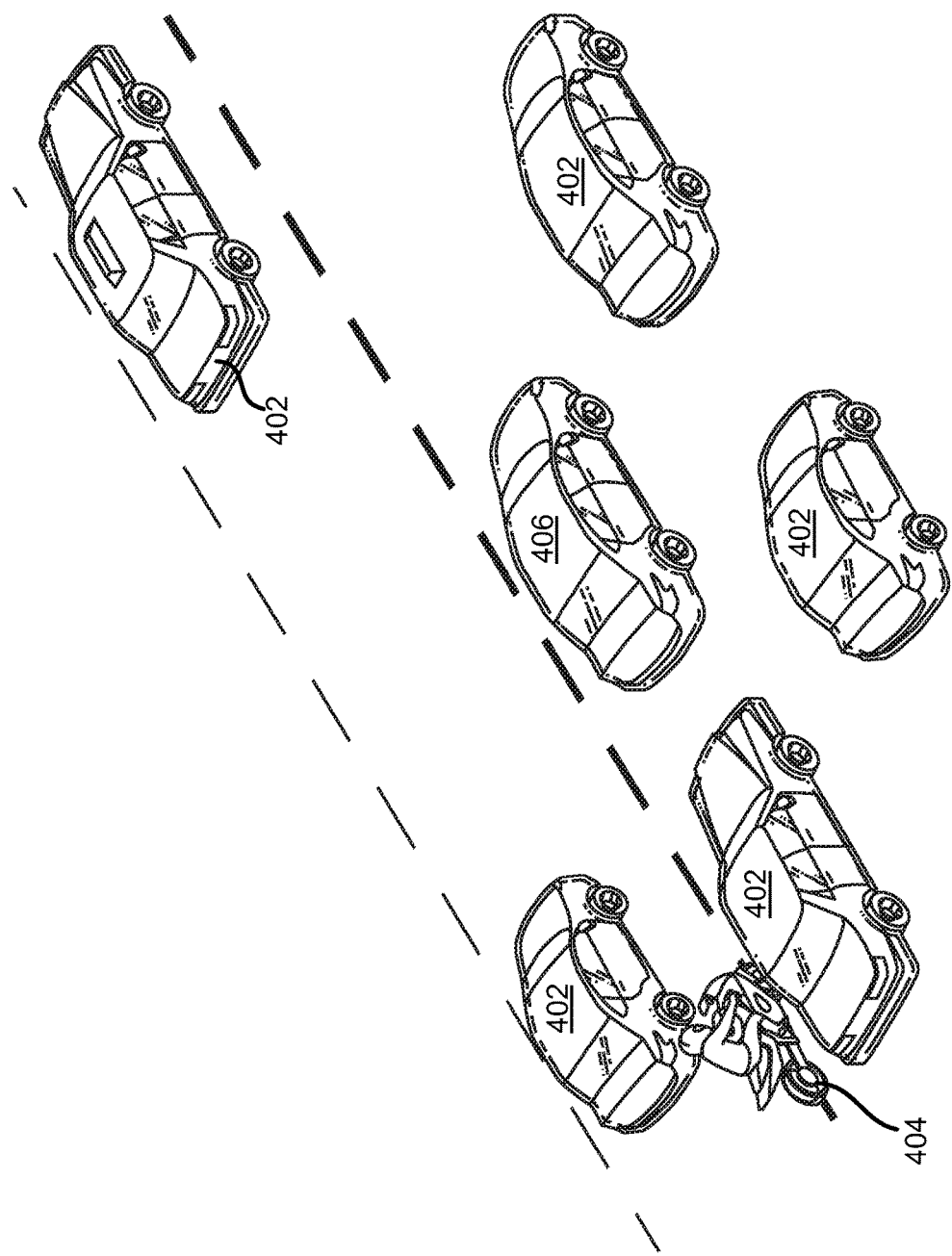

GENERATING SIMULATED SENSOR DATA FOR TRAINING AND VALIDATION OF DETECTION MODELS

BACKGROUND

Field of the Invention

This invention relates to performing obstacle avoidance in autonomous vehicles.

Background of the Invention

Most active and passive safety features available in vehicles today detect obstacles using sensors such as ultrasonic sensors, cameras, LIDAR, RADAR, etc. The vehicle controller must classify and track objects in dynamic environments accurately. Many of such features, like emergency brake assist aim to prevent forward collisions with solid objects, e.g. poles, pedestrians, other vehicles, which would potentially cause casualties or property damage.

There are several limitations on sensor data, which is commonly noisy, sparse, and inaccurate. In addition to this, data inconsistencies such as "ghost objects" tend to appear in different scenarios. These data imperfections can cause unnecessary intervention by active safety features and inconvenience by passive safety features repeatedly alerting the driver.

The systems and methods disclosed herein provide an improved approach for obstacle detection by a vehicle.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which:

FIGS. 4A and 4B illustrate a scenario for evaluating or training a model in accordance with an embodiment of the present invention;

DETAILED DESCRIPTION

Figure 1A:
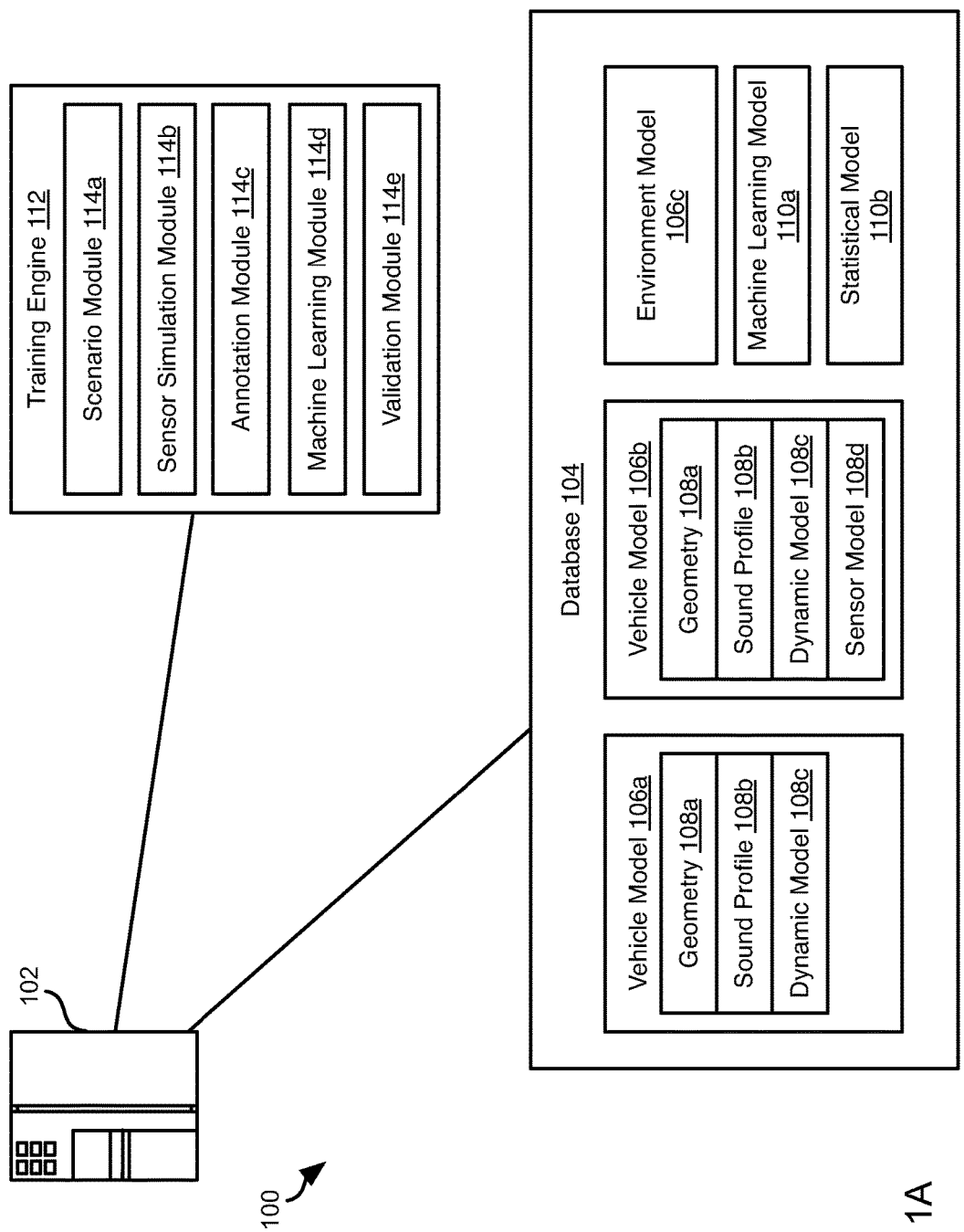
FIGS. 1A and 1B are schematic block diagrams of a system for implementing embodiments of the invention.

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

Embodiments in accordance with the present invention may be embodied as an apparatus, method, or computer program product. Accordingly, the present invention may take the form of an entirely hardware embodiment, an entirely software embodiment (including firmware, resident software, micro-code, etc.), or an embodiment combining software and hardware aspects that may all generally be referred to herein as a "module" or "system." Furthermore, the present invention may take the form of a computer program product embodied in any tangible medium of expression having computer-usable program code embodied in the medium.

Any combination of one or more computer-usable or computer-readable media may be utilized. For example, a computer-readable medium may include one or more of a portable computer diskette, a hard disk, a random access memory (RAM) device, a read-only memory (ROM) device, an erasable programmable read-only memory (EPROM or Flash memory) device, a portable compact disc read-only memory (CDROM), an optical storage device, and a magnetic storage device. In selected embodiments, a computer-readable medium may comprise any non-transitory medium that can contain, store, communicate, propagate, or transport the program for use by or in connection with the instruction execution system, apparatus, or device.

Computer program code for carrying out operations of the present invention may be written in any combination of one or more programming languages, including an object-oriented programming language such as Java, Smalltalk, C++, or the like and conventional procedural programming languages, such as the "C" programming language or similar programming languages. The program code may execute entirely on a computer system as a stand-alone software package, on a stand-alone hardware unit, partly on a remote computer spaced some distance from the computer, or entirely on a remote computer or server. In the latter scenario, the remote computer may be connected to the computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions or code. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transitory computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Referring to FIG. 1A, a network environment 100 may include a server system 102 that hosts or accesses a database 104 including data sufficient to define a scenario for training or evaluation of a detection system. In particular, the database 104 may store vehicle models 106a that include geometry data 108a for the vehicle, e.g. the shape of the body, tires, and any other visible features of the vehicle. The geometry data 108a may further include material data, such as hardness, reflectivity, or material type. The model 106 may further include a sound profile 108b that includes audio files or other data characteristic of sound produced by the vehicle under certain circumstances, e.g. different speeds and different levels of accelerations at different speeds. The vehicle model 106a may further include a dynamic model 108c that indicates operation limits of the vehicle, e.g. turning radius, acceleration profile (maximum acceleration at a particular speed), and the like. The vehicle models 106a may be based on actual vehicles and the fields 108a-108c may be populated using data obtained from measuring the actual vehicles.

In some embodiments, the database 104 may store a vehicle model 106b for a vehicle incorporating one or more sensors that are used for obstacle detection. As described below, the outputs of these sensors may be input to a model that is trained or evaluated according to the methods disclosed herein. Accordingly, the vehicle model 106b may additionally include one or more sensor models 108d that indicate the locations of one or more sensors on the vehicle, the orientations of the one or more sensors, and one or more descriptors of the one or more sensors. For example, for a microphone, the sensor model 108d may include the gain, signal to noise ratio, sensitivity profile (sensitivity vs. frequency), and the like. For a camera, the sensor model 108d may include the field of view, resolution, zoom, frame rate, or other operational limit of the camera. For a LIDAR or RADAR sensor, the sensor model 108d may include a resolution, field of view, and scan rate of the system.

As described in greater detail herein, sensor noise may be simulated in simulated outputs of the sensors of the vehicle model 106b. Accordingly, the sensor model 108d may one or both of (1) be sufficiently accurate or simulated with sufficient level of detail such that noise will result from simulated perception of a scenario by the sensor (2) include a definition of noise typically present in an output of the sensor such that noise may be randomly added to a simulated perception of the scenario by the sensor model.

The database 104 may include an environment model 106c that includes models of various landscapes, such models of city streets with intersections, buildings, pedestrians, trees etc. The models may define the geometry and location of objects in a landscape and may further include other aspects such as reflectivity to laser, RADAR, sound, light, etc. in order to enable simulation of perception of the objects by a sensor.

The database 104 may store a machine learning model 110a. The machine learning model 110a may be trained using the models 106a-106c according to the methods described herein. The machine learning model 110a may be a deep neural network, Bayesian network, or other type of machine learning model.

The database 104 may store a statistical model 110b. The statistical model may define an approach for updating a probability for a predicted location of an obstacle or occupancy of a particular position outside of a vehicle. Examples of these statistical models 110b are described below with respect to FIGS. 5 through 11. As also described below, these statistical models may be evaluated and modified by processing simulated sensor outputs that simulate perception of a scenario by the sensors of the vehicle model 106b. The approaches described below with respect to FIGS. 5 through 9 are described and claimed in U.S. application Ser. No. 15/346,210, filed Nov. 8, 2016, and entitled "Object Tracking Using Sensor Fusion Within A Probabilistic Framework" and U.S. application Ser. No. 15/363,763, filed Nov. 29, 2016, and entitled Multi-Sensor Probabilistic Object Detection and Automated Braking, both of which are hereby incorporated herein by reference in their entirety.

The server system 102 may execute a training engine 112. The training engine 112 may include a scenario module 114a. The scenario module 114a may retrieve models 106a-106c and generate a scenario of models of vehicles moving along models of roads. The scenario module 114a may generate these scenarios manually or receive human inputs specifying initial locations of vehicles, velocities of vehicles, etc. In some embodiments, scenarios may be modeled based on video or other measurements of an actual location, e.g. observations of a location, movements of vehicles in the location, the location of other objects, etc.

In some embodiments, the scenario module 114a may read a file specifying locations and/or orientations for various elements of a scenario and create a model of the scenario having models of the elements positioned as instructed in the file. In this manner, manually or automatically generated files may be used to define a wide range of scenarios.

The training engine 112 may include a sensor simulation module 114b. In particular, for a scenario, and a vehicle included in the scenario including sensor model data 108d, a perception of the scenario by the sensors may be simulated by the sensor simulation module 114b as described in greater detail below.

The training engine 112 may include an annotation module 114c. Simulated sensor outputs from the sensor simulation module 114b may be annotated with "ground truth" of the scenario indicating the actual locations of obstacles in the scenario. The annotations may also indicate a range of locations or areas occupied by obstacles, e.g. vehicles.

The training engine 112 may include a machine learning module 114d. The machine learning module 114d may train the machine learning model 110a. For example, the machine learning model 110a may be trained to identify the location of obstacles by inputting the simulated sensor outputs as well as the location of obstacles in the scenario. In particular, the sensor outputs may be provided as an input data set and the relative location of the lane-splitting vehicle may be provided as the desired output for the input data set.

In some embodiments, the training engine 112 may include a validation module 114e. The validation module 114e processes the simulated sensor outputs according to a statistical model, such as one of the statistical models described below with respect to FIGS. 5 through 11. The validation module 114e may then characterize accuracy of the statistical model as compared to the annotations of the annotation module 114c. For example, where the statistical model produces an output indicating a high probability that an obstacle is at a given location, this location may be compared to the annotations. A distance between this location and a location indicated in the annotations may be compared. The larger the distance, the lower the accuracy of the statistical model.

Figure 1B:
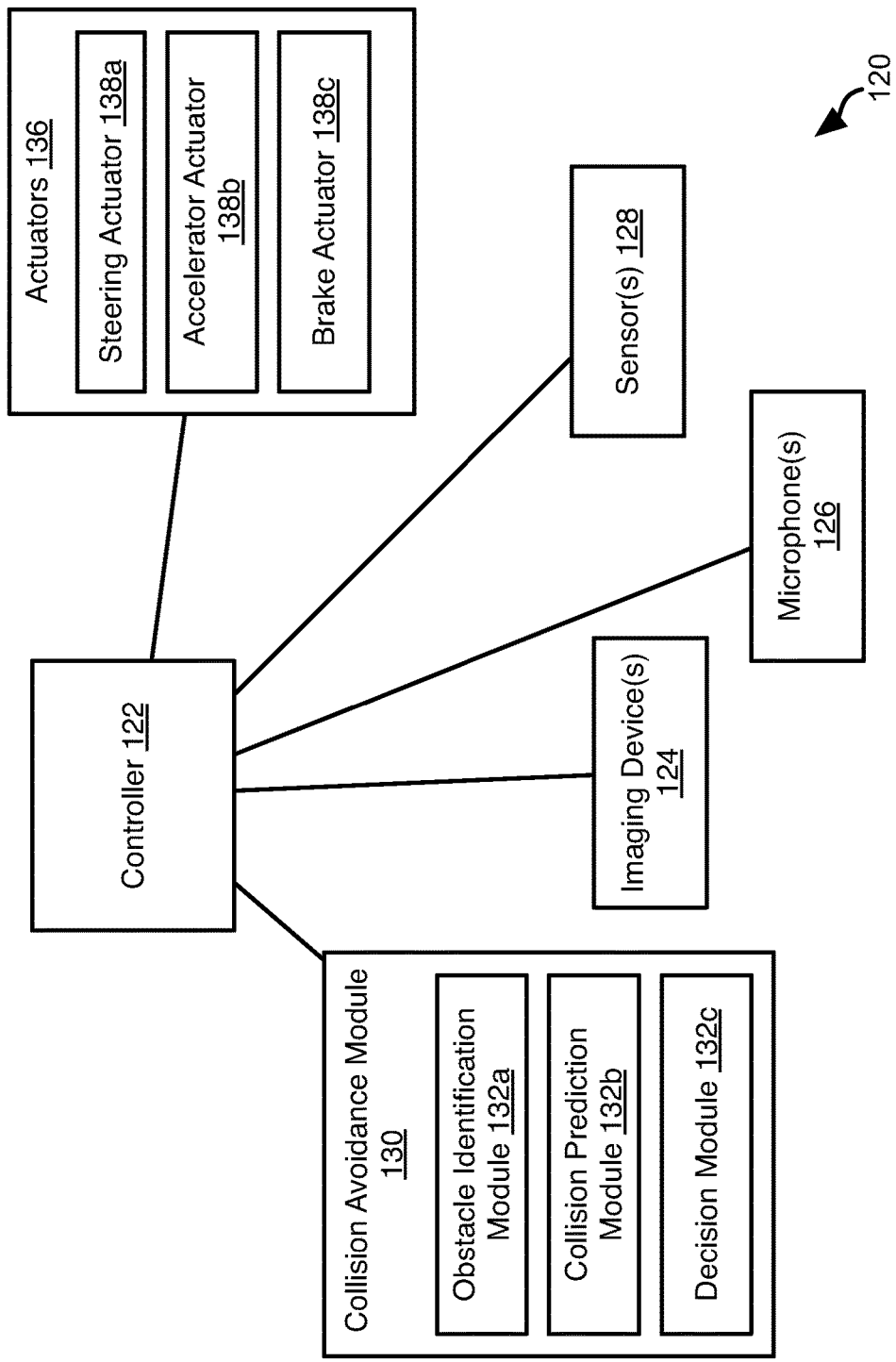

Referring to FIG. 1B, the machine learning model 110a or statistical model 110b as validated or generated using the system of FIG. 1A may be used to perform obstacle detection in the illustrated system 120 that may be incorporated into a vehicle, such as an autonomous or human-operated vehicle. For example, the system 120 may include controller 122 housed within a vehicle. The vehicle may include any vehicle known in the art. The vehicle may have all of the structures and features of any vehicle known in the art including, wheels, a drive train coupled to the wheels, an engine coupled to the drive train, a steering system, a braking system, and other systems known in the art to be included in a vehicle.

As discussed in greater detail herein, the controller 122 may perform autonomous navigation and collision avoidance using sensor data. Alternatively, the controller 122 may identify obstacles and generate user perceptible results using sensor data. In particular, the controller 122 may identify obstacles in sensor data using a machine learning or statistical model as described below with respect to FIGS. 3A through 11.

The controller 122 may receive one or more image streams from one or more imaging devices 124. For example, one or more cameras may be mounted to the vehicle and output image streams received by the controller 122. The controller 122 may receive one or more audio streams from one or more microphones 126. For example, one or more microphones or microphone arrays may be mounted to the vehicle and output audio streams received by the controller 122. The microphones 126 may include directional microphones having a sensitivity that varies with angle.

In some embodiments, the system 120 may include other sensors 128 coupled to the controller 122, such as LIDAR (light detection and ranging), RADAR (radio detection and ranging), SONAR (sound navigation and ranging), ultrasonic sensor, and the like. The locations and orientations of the sensing devices 124, 126, 128 may correspond to those modeled in the sensor model 108d used to train the machine learning model 110a.

The controller 122 may execute a collision avoidance module 130 that receives outputs from some or all of the imaging devices 124, microphones 126, and other sensors 128. The collision avoidance module 130 then analyzes the outputs to identify potential obstacles The collision avoidance module 130 may include an obstacle identification module 132a, a collision prediction module 132b, and a decision module 132c. The obstacle identification module 132a analyzes outputs of the sensing devices 124, 126, 128 and identifies potential obstacles, including people, animals, vehicles, buildings, curbs, and other objects and structures. In particular, the obstacle identification module 132a may identify obstacles using a machine learning model or statistical model as described below with respect to FIGS. 3 through 11.

The collision prediction module 132b predicts which obstacle images are likely to collide with the vehicle based on its current trajectory or current intended path. The collision prediction module 132b may evaluate the likelihood of collision with objects identified by the obstacle identification module 132a as well as obstacles detected using the machine learning module 132a. The decision module 132c may make a decision to stop, accelerate, turn, etc. in order to avoid obstacles. The manner in which the collision prediction module 132b predicts potential collisions and the manner in which the decision module 132c takes action to avoid potential collisions may be according to any method or system known in the art of autonomous vehicles.

The decision module 132c may control the trajectory of the vehicle by actuating one or more actuators 136 controlling the direction and speed of the vehicle. For example, the actuators 136 may include a steering actuator 138a, an accelerator actuator 138b, and a brake actuator 138c. The configuration of the actuators 138a-138c may be according to any implementation of such actuators known in the art of autonomous vehicles.

The decision module 132c may additionally or alternatively invoke generation of a driver perceptible alert in response to detecting a potential collision rather than invoking autonomous collision avoidance.

Figure 2:
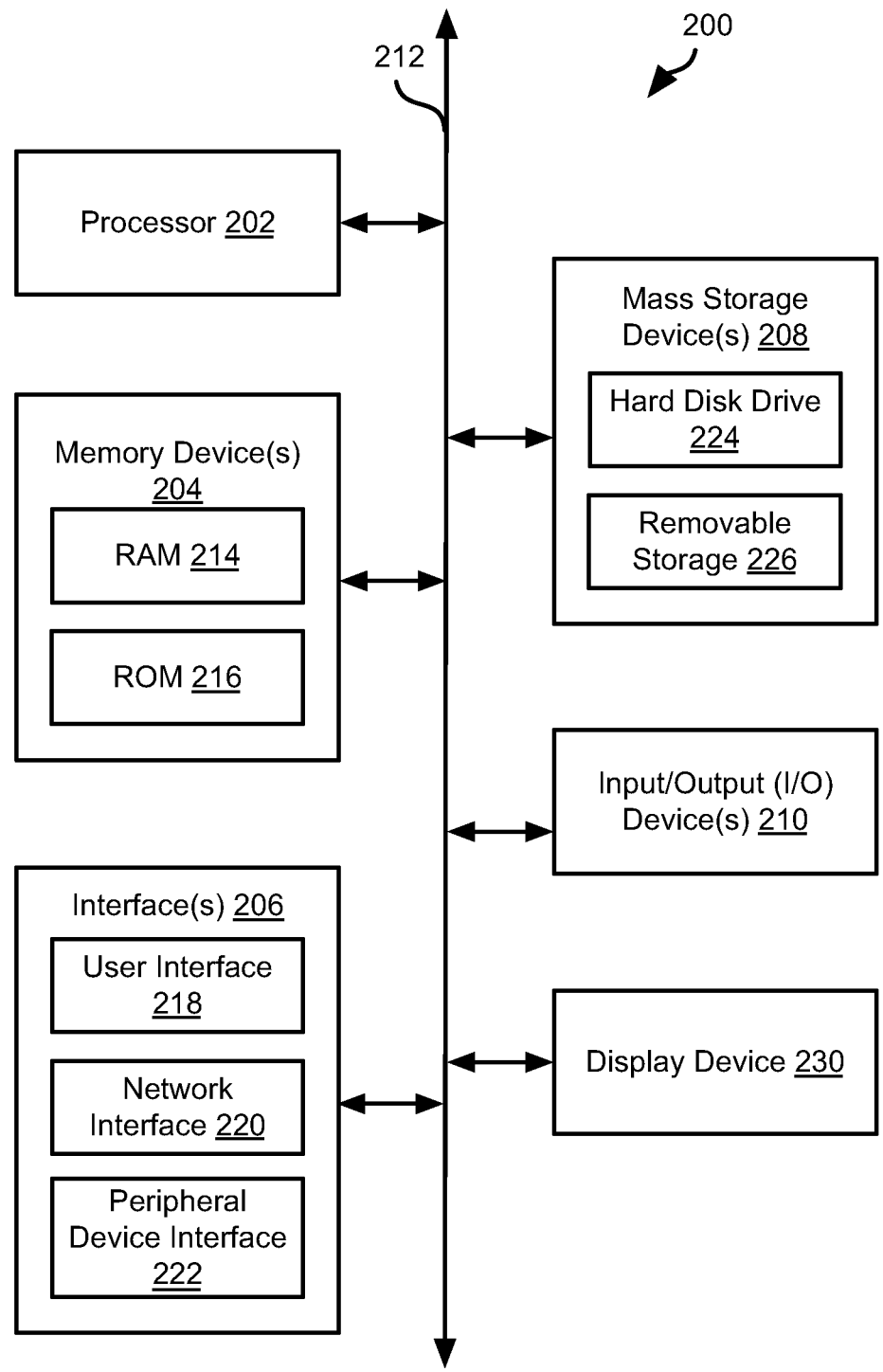
FIG. 2 is a schematic block diagram of an example computing device suitable for implementing methods in accordance with embodiments of the invention.

FIG. 2 is a block diagram illustrating an example computing device 200. Computing device 200 may be used to perform various procedures, such as those discussed herein. The server system 102 and controller 122 may have some or all of the attributes of the computing device 200.

Computing device 200 includes one or more processor(s) 202, one or more memory device(s) 204, one or more interface(s) 206, one or more mass storage device(s) 208, one or more Input/Output (I/O) device(s) 210, and a display device 230 all of which are coupled to a bus 212. Processor(s) 202 include one or more processors or controllers that execute instructions stored in memory device(s) 204 and/or mass storage device(s) 208. Processor(s) 202 may also include various types of computer-readable media, such as cache memory.

Memory device(s) 204 include various computer-readable media, such as volatile memory (e.g., random access memory (RAM) 214) and/or nonvolatile memory (e.g., read-only memory (ROM) 216). Memory device(s) 204 may also include rewritable ROM, such as Flash memory.

Mass storage device(s) 208 include various computer readable media, such as magnetic tapes, magnetic disks, optical disks, solid-state memory (e.g., Flash memory), and so forth. As shown in FIG. 2, a particular mass storage device is a hard disk drive 224. Various drives may also be included in mass storage device(s) 208 to enable reading from and/or writing to the various computer readable media. Mass storage device(s) 208 include removable media 226 and/or non-removable media.

I/O device(s) 210 include various devices that allow data and/or other information to be input to or retrieved from computing device 200. Example I/O device(s) 210 include cursor control devices, keyboards, keypads, microphones, monitors or other display devices, speakers, printers, network interface cards, modems, lenses, CCDs or other image capture devices, and the like.

Display device 230 includes any type of device capable of displaying information to one or more users of computing device 200. Examples of display device 230 include a monitor, display terminal, video projection device, and the like.

Interface(s) 206 include various interfaces that allow computing device 200 to interact with other systems, devices, or computing environments. Example interface(s) 206 include any number of different network interfaces 220, such as interfaces to local area networks (LANs), wide area networks (WANs), wireless networks, and the Internet. Other interface(s) include user interface 218 and peripheral device interface 222. The interface(s) 206 may also include one or more peripheral interfaces such as interfaces for printers, pointing devices (mice, track pad, etc.), keyboards, and the like.

Bus 212 allows processor(s) 202, memory device(s) 204, interface(s) 206, mass storage device(s) 208, I/O device(s) 210, and display device 230 to communicate with one another, as well as other devices or components coupled to bus 212. Bus 212 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 200, and are executed by processor(s) 202. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

Figure 3A:
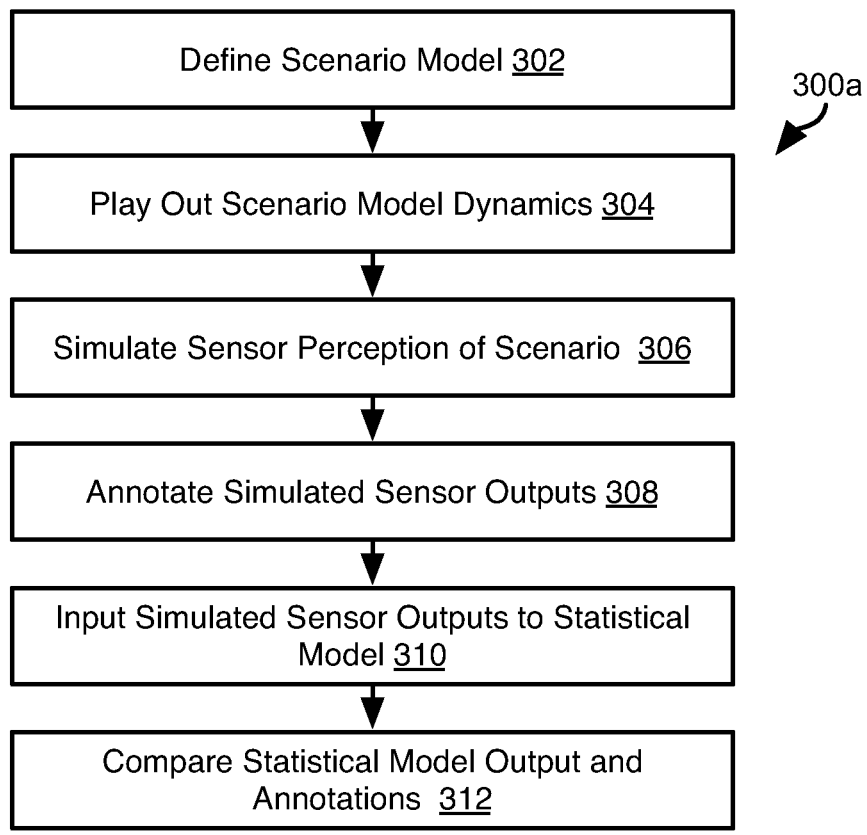
FIGS. 3A and 3B are process flow diagrams of a method for generating simulated sensor data for evaluating a statistical model in accordance with an embodiment of the present invention.
Figure 4A:
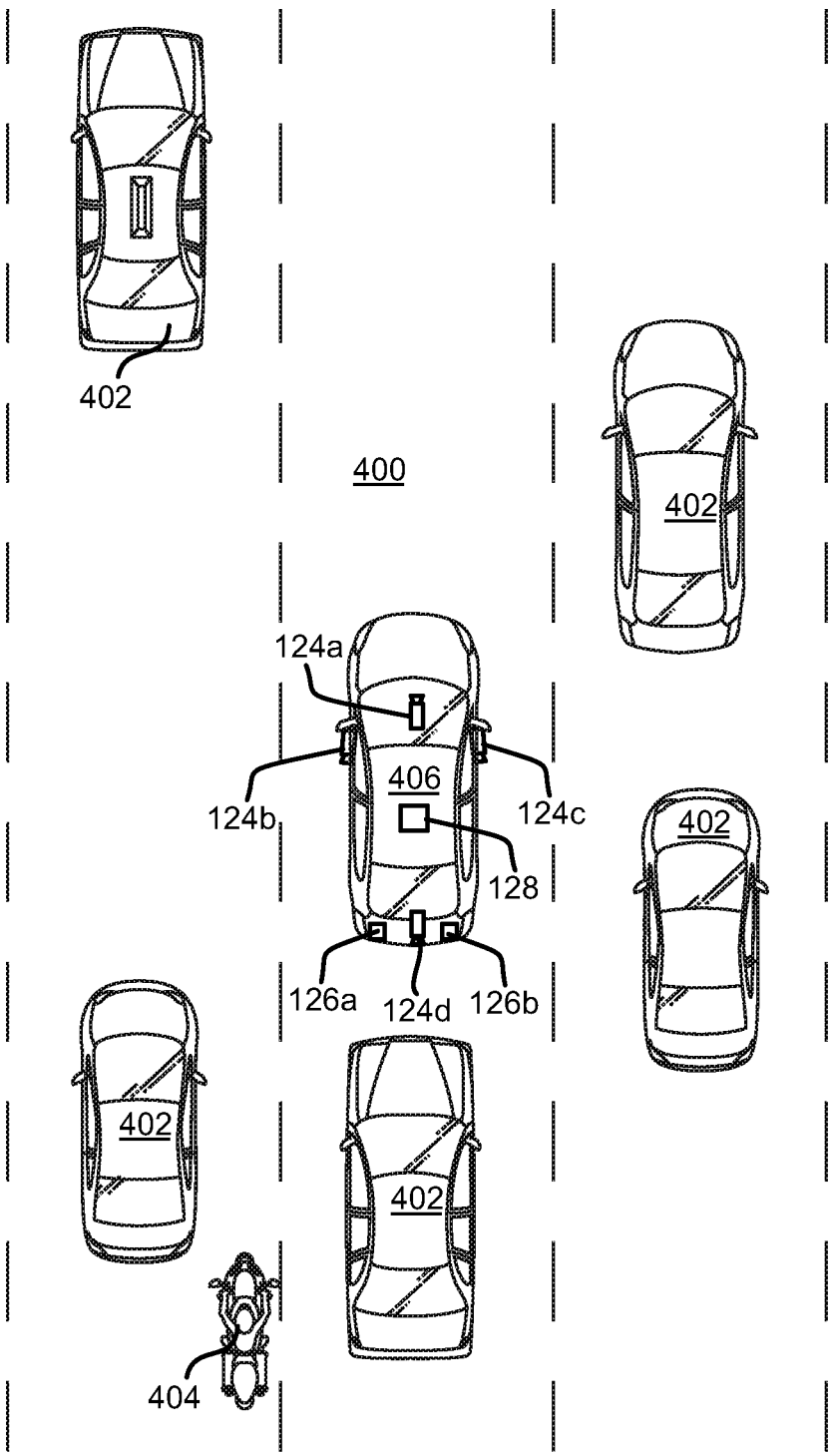

Referring to FIG. 3A, the illustrated method 300a may be executed by the server system 102 in order to evaluate a statistical model 110b. The method 300a may include defining 302 a scenario model. For example, as shown in FIGS. 4A and 4B, an environment model including a road 400 may be combined with models of vehicles 402, 404 placed within lanes of the road 400 and having velocities and accelerations that may vary from one time step to the next during propagation of the scenario model.

A subject vehicle 406 may also be placed in the model and may have a velocity and acceleration that varies from one time step to the next. Perception of the scenario by microphones, imaging devices, and/or other sensors may be simulated from the point of view of the subject vehicle 406. In particular locations and orientations of imaging devices 124a-124d, microphones 126a, 126b, and other sensors 128 (e.g. LIDAR, RADAR, SONAR) may be defined on the subject vehicle 406 in accordance with a sensor model 108d.

The method 300a may include playing out 304 the scenario model dynamics. In particular, each vehicle 402, 404, 406 in the model may have a pre-defined velocity or position profile that defines how the velocity and/or profile is to change over time. Accordingly, playing out 304 the scenario may include simulating a plurality of discrete time steps wherein for each time step, each vehicle 402, 404, 406 is moved to different position within the model according to the pre-defined velocity or position profile.

The method 300a may further include simulating 306 sensor perception of the scenario. For example, for each time step, the state of the model (e.g. positions and velocities of the vehicles 402, 404, 406 at that time step) may be captured from the point of view of a particular sensor. In particular, the position of the sensors according to the sensor model 108d on the subject vehicle 406 and the operational capacity of the sensors as defined in the sensor model 108d may be used to simulate a sensor output.

For example, for each imaging device, a rendering of the scenario from the point of view of the imaging device on the subject vehicle 406 may be generated. For a microphone, sound incident on the microphone during the time step as propagated from the vehicles 402, 404, 406 to the location of the microphone on the subject vehicle may be simulated. Simulating sound may include simply simulating the time of travel from a source of the sound and any Doppler effects. Simulating sound may further include simulating reflections off of vehicles, the ground, or buildings that may arrive at the microphone location.

For a LIDAR sensor, a point cloud from the point of view of the LIDAR sensor may be simulated, where the points of the point cloud are points of structures of the environment or vehicles 402, 404, 406 of the scenario that are in the field of view of the LIDAR sensor. In some LIDAR systems, points measured may include both a three-dimensional coordinate and a reflectivity value. In some embodiments, the models 106a, 106b may include reflectivity values for exterior surfaces thereof. Accordingly, for points of the point cloud in the point of view of the LIDAR system, the reflectivity value of the structure including each point may be included. Perception of the scenario model by various other sensors may also be included. For a RADAR or SONAR system, reflections from objects and vehicles of the scenario may be simulated for each time step.

In the method 300a, step 306 may include simulating perception of the scenario by the sensor models such that noise is present in the simulated sensor outputs. Accordingly, propagation of sound may be simulated to model echoes off of buildings or other vehicles. Propagation of RADAR signals may be modeled such that propagation of electromagnetic waves is simulated in sufficient detail to capture multiple reflections that may create "ghost objects" and other noise in the output of the RADAR sensor. Likewise, for LIDAR, raytracing may be performed in sufficient detail to capture multiple reflections and may simulate atmospheric attenuation and scattering of the laser beam of the LIDAR sensor.

The various sensors may have different frame or scanning rates than the time step of updating the scenario model. Accordingly, more or fewer outputs may be produced then the number of times steps. For example, for sound, the number of samples required in order to accurately simulate detection of sound may be greater than the time step. Accordingly, multiple samples may be taken for each time step. For example, the time step may be subdivided into smaller time steps and simulated samples of sound propagated through the scenario model and incident on the microphone location may be recorded. In a similar manner, images from an imaging device, point clouds from LIDAR, reflections from RADAR or SONAR may be simulated at different periods that are smaller or larger than the time step.

The result of the simulating of sensor perception at step 306 may be a streams of sensor outputs, e.g. a series of images, an audio signal, a set of point clouds, a sets of reflections at different time points, etc. The streams of sensor outputs may be annotated 308 with the state of the scenario at the time step in which the sensor outputs were received according to the modeling of the scenario. For example, annotating 308 may include listing the locations and/or relative velocity of obstacles in the scenario at a given time step, such as vehicles, pedestrians, signs, buildings, and the like. Locations and velocity may be included in the annotation relative to the position of the subject vehicle 406.

The method 300a may further include inputting 310 the simulated sensor outputs to a statistical model. For example, the simulated sensor outputs may be input to the statistical models described below with respect to FIGS. 5 through 11.

The method 300a may further include comparing 312 the statistical model output to the annotations. As described in detail below with respect to FIGS. 5 through 11, a statistical model may produce an output indicating that an obstacle is present or is present at a given location when a calculated probability meets a threshold condition. Accordingly, step 312 may include comparing a finding of the statistical model that an obstacle is present or not present at a given point of time with the annotations that indicate whether an obstacle was present in the scenario at that point in time. Where the statistical model provides a location having an above-threshold probability as being the location of an obstacle, this location may be compared to the annotations to determine whether the scenario included an obstacle at that location. The comparison of step 312 may be manual or automated. Step 312 may include tuning one or more parameters of the model either manually or automatically based on an output of the comparison.

Figure 3B:
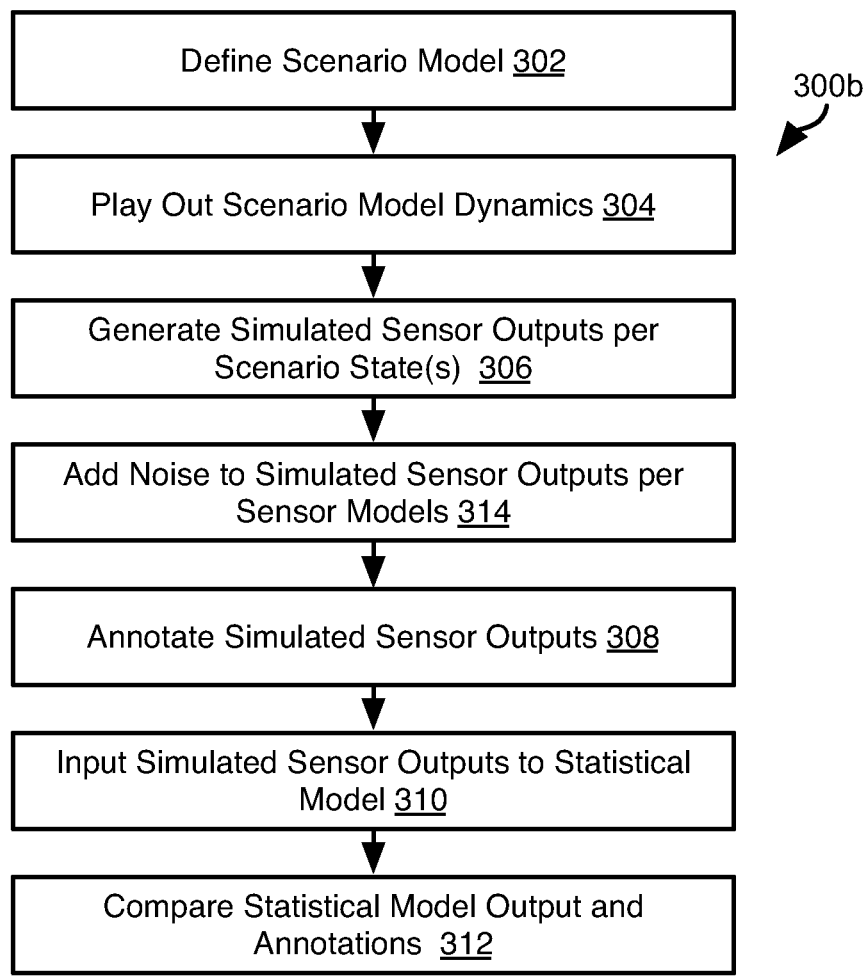

Referring to FIG. 3B, in another embodiment, a method 300b includes steps 302-312 as described above with respect to FIG. 3A. However, step 306 may not be modeled in sufficient detail to create sufficient sensor noise in the simulated sensor outputs. Instead, the simulated sensor outputs may be modified at step 314 to include noise. The noise added at step 314 may be added as random signals defined according to a model of noise of the sensor determined experimentally. The modified simulated sensor outputs may then be input to the statistical model at step 310 and processed as described above with respect to FIG. 3A.

Figure 3C:
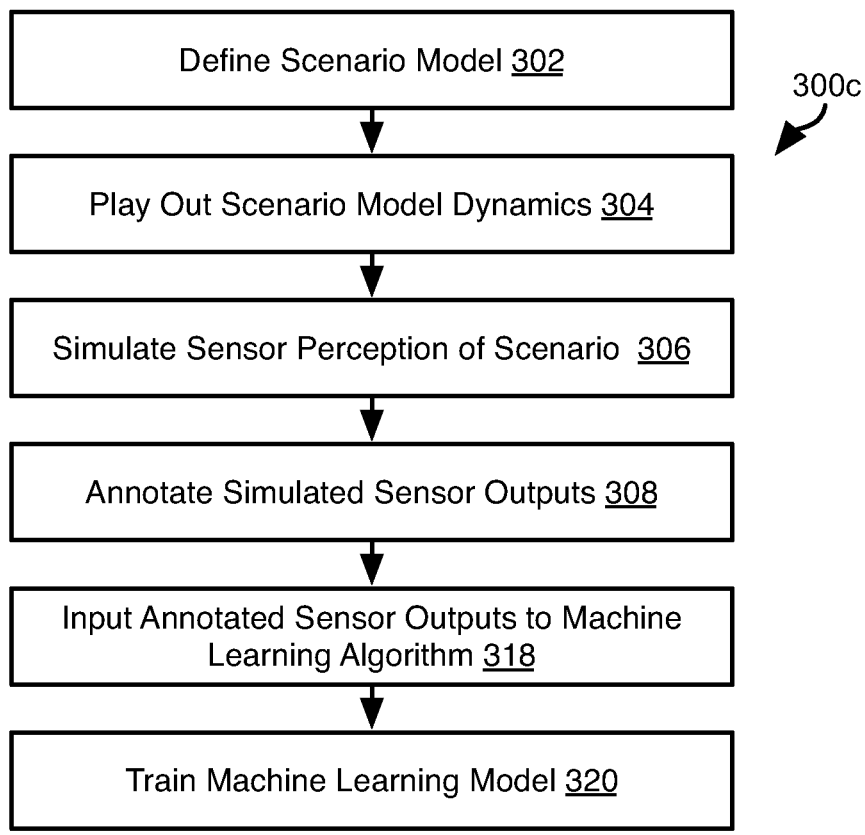
FIG. 3C is a process flow diagram of a method for training a machine-learning model using simulated sensor data in accordance with an embodiment of the present invention.

Referring to FIG. 3C, in another embodiment, a method 300c may include steps 302-308 as described above with respect to FIG. 3A. Step 306 may include modeling effective to create noise in simulated sensor outputs and may additionally or alternatively include adding noise as described for step 314 of FIG. 3B.

The method 300b may further include inputting 318 the annotated simulated sensor outputs may to a machine learning algorithm and training 320 the machine learning model using the annotated simulated sensor outputs.

For example, for each time step, one or more sensor outputs for each type of sensor that were simulated for that time step may be input 318 to the machine learning algorithm. Likewise, the position of obstacles in the scenario at that time step may be input to the model, e.g. the relative position of the vehicle 404 to the vehicle 406 in the scenario model at that time step. For audio signals, the time step may be too short for a meaningful analysis. Accordingly, samples of simulated sound may be input to the model at step 318 for multiple time steps preceding and/or following the each time step, i.e. a window of time steps including the each time step.

The machine learning model 110a may be then be trained 320 by updating the model 110a for the sensor outputs input 318 for each time step and the locations of obstacles of the scenario at each time step. The manner in which the machine learning algorithm trains the model 110a may be performed according to any manner known in the art of machine learning. Likewise, the sensor outputs may be input to the machine learning algorithm in a continuous manner rather than as discrete data sets for individual time steps.

The result of the method 300c is a machine learning model 110a that is trained to output for an input stream of sensor outputs he locations of obstacles detected according to the sensor outputs. Many machine learning algorithms further output a confidence score indicating how the probability that an output of the models is correct. Accordingly, for a corresponding confidence score may also be output by the model for each obstacle detected.

The machine learning model trained according to step 320 may then be loaded into a vehicle controller 122, which then inputs sensor outputs to the model and performs obstacle avoidance with respect to obstacles detected according to outputs of the model.

Figure 5:
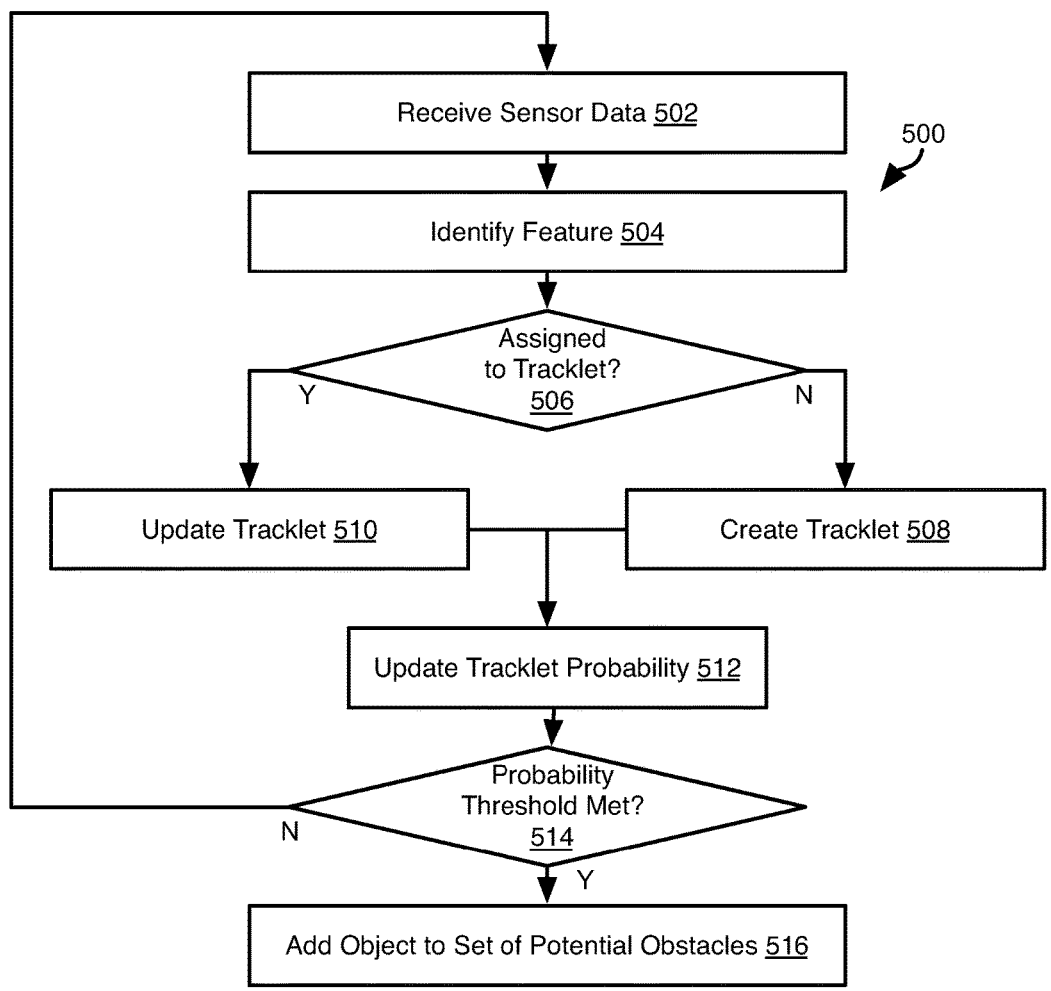
FIG. 5 is a process flow diagram of a method for tracking obstacles using a tracklets in accordance with an embodiment of the present invention.

FIG. 5 illustrates an example method 500 that uses a statistical model to detect obstacles. Accordingly, simulated sensor outputs according to step 306 of the methods 300a, 300b may be processed at step 318 according to the method 500. The locations of obstacles determined according to the method 500 may then be compared at step 312 to the location of obstacles in the scenario included in the annotations to the simulated sensor outputs from step 308.

The method 500 provides an approach by which tracklets that each represent detected obstacles are created and updated. The method 500 may be executed by the server system 102 in the context of the methods 300a, 300b or by the vehicle controller 122 when used for actual obstacle detection.

The method 500 may include receiving 502 sensor data, which is simulated sensor data in the context of the methods 300a, 300b or actual sensor data when in use in an actual vehicle. Hereinafter, the references to "sensor data" and "sensors" shall be understood to refer to actual sensor data from sensors 124, 126, 128 when the method 500 is performed by a vehicle controller 122. "Sensor data" and "sensors" shall be understood to refer to simulated sensor data and models 108d of sensors perceiving a scenario where the method 500 is performed in the context of either of the methods 300a, 300b.

Receiving 502 sensor data may include receiving data from an individual sensor. For example, the method 500 may be executed for each frame of data received from any of the sensors. Alternatively, frames of data received from multiple sensors may be processed simultaneously according to the method 500. In some embodiments, the sensors may have different frame rates such that separate processing is performed.

The method 500 may include identifying 504 features in the sensor data. Step 504 may include any technique for identifying objects in sensor data as known in the art. Step 504 may include identifying features in the sensor data that are consistent with presence of objects such as vehicles, people, animals, signs, buildings, or any other object that may be present.

The output of step 504 may be a listing of data objects that each represent a detected feature. The data objects may include a location, e.g. a coordinate of a center, of the feature, an extent of the feature, a total volume or facing area or the size or vertex locations of a bounding box or cube, or other data. There are various sensors by which objects are detected and each may define its own coordinate system. Accordingly, the location data of step 504 may be translated from the coordinate system of the sensor in which the feature was detected into a common coordinate system, such as a coordinate system of one of the sensors that is designated as the common coordinate system. The translation may be determined by a calibration step wherein objects at known locations are detected using the various sensors and the sensor outputs evaluated to map sensor outputs to the common coordinate system.

The method 500 may include evaluating 506 whether the feature has been assigned to an existing tracklet. Each tracklet may be a data object that contains some or all of the data of the features identified at step 504, e.g. a location and extent. The tracklet may further include a trajectory. Accordingly, step 506 may include determining whether a feature has a location and extent corresponding to an existing tracklet, e.g. within some tolerance values of the location and extent of the location and extent of an existing tracklet. A tracklet may include a trajectory such that a predicted location of the object may be determined from the trajectory. Accordingly, step 506 may include determining whether the size and extent of the feature correspond to the extent and predicted location of an existing tracklet, e.g. within some tolerances of these values.

If not, then a tracklet may be created 508. In some embodiments, a tracklet is created for a detected feature only if certain conditions are met, such as repeated detection of the feature for a minimum number of data frames and/or behavior consistent with a real object. For example, step 508 may be performed by executing the method 600 of FIG. 6, which may include refraining from creating a tracklet in some circumstances.

If a corresponding tracklet is found 506 to exist, then the method 500 may include updating 510 that tracklet. For example, the location and extent of the feature identified at step 504 may be added to the tracklet as the most recent location and extent measured. Updating 510 may include adding the data from the data object of step 504 to the tracklet and performing Kalman filtering with respect to the data from step 504 and from step 504 for previous iterations of the method 500. As known in the art, Kalman filtering may be used for object tracking using various sensor outputs in order to remove sensor noise and provide an estimate of an object's trajectory.

The method 500 may include updating 512 the probability of the tracklet that is updated at step 510 or created at step 508. In some embodiments, updating 512 may include processing the features identified at step 504 according to a Bayesian statistical model wherein each sensor output is processed to determine an impact on a probability that an object represented by the tracklet exists. For an existing tracklet, step 512 may include performing a Bayesian probability update using the feature identified at step 504.

In some embodiments, updating 512 the tracklet probability may include updating the probability such that only the number of times the object represented by the tracklet is identified determines the probability. In other embodiments, other data may be incorporated into the statistical model, such as the variance of the sensor in which the feature of step 504 was identified, the variation of the location data with respect to a Kalman filtered trajectory, or other factors. In some embodiments, distance to a feature may be a factor in updating 512 the probability, such that the probability is increased more for features that are closer to the vehicle 300*a* as compared to features that are farther away from the vehicle 300*a*.

The probability updating step 512 enables the fusion of outputs of multiple sensors in that each time the object corresponding to a tracklet is detected by any sensor, the probability will increase. Accordingly, the location of an object may be confirmed using various sensors having different sensing modalities in order to avoid false positives due to noise in the output of a single sensor or type of sensor.

If the probability as updated at step 512 is found 514 to meet some threshold confidence level, then one or more actions may be taken. For example, an object at the location and having the trajectory recorded in the tracklet may be added 516 to a set of potential obstacles and collision avoidance may be performed with respect to this set of obstacles.

In some embodiments, an alert to a driver may be generated if the trajectory of the vehicle 300*a* and the object indicate collision will occur absent a change in bearing. This is particularly useful where the vehicle 300*a* is not an autonomous vehicle or is operating semi-autonomously with the possibility of human intervention.

Figure 6:
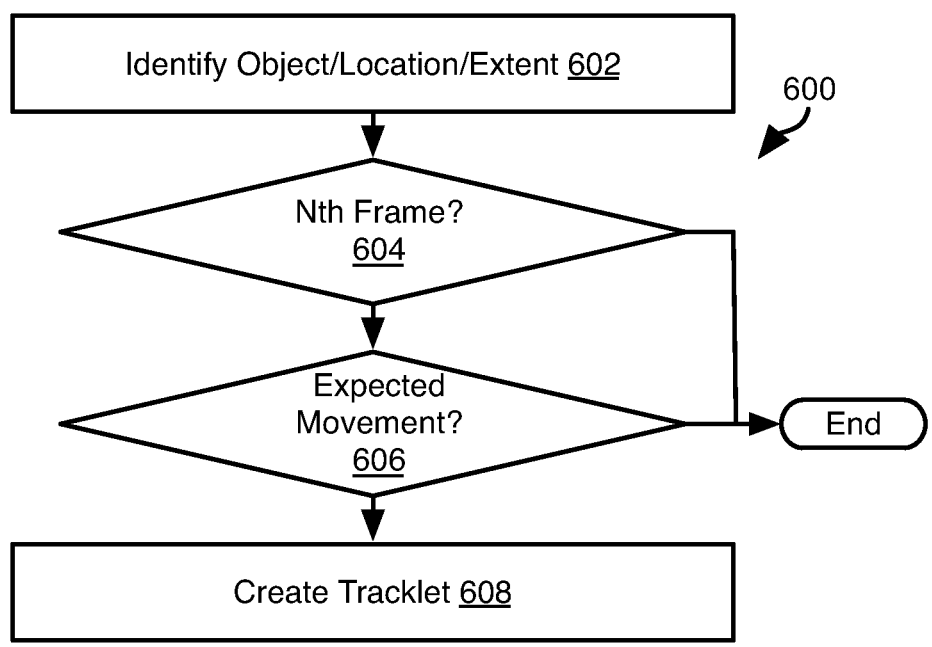
FIG. 6 is a process flow diagram of a method for creating tracklets in accordance with an embodiment of the present invention.

Referring to FIG. 6, the illustrated method 600 may be executed at step 508 of the method 500 in order to determine whether to create a tracklet for a feature detected in the output of one or more sensors.

The method 600 may include identifying 602 properties of the feature from the sensor data, such as its location, extent, shape, or the like. The method 600 may further include determining whether the feature is the Nth occurrence of this feature in a set of N contiguous sensor frames, where N is an integer, such as an integer from 10 to 30, preferably 20. The sensor frames may represent a set of data obtained from a particular sensor. The N sensor frames may be sensor frames from the same sensor or from multiple sensors having different sensing modalities. Whether the feature is present in the N contiguous frames may include determining that a feature having the properties of step 602 (extent, location, shape, etc.) was present in the N contiguous frames.

The method 600 may further include evaluating 604 whether the variation in the location of the feature in the N contiguous frames is consistent with a real object. An object may be moving, accordingly, whether the N contiguous frames include features likely corresponding to the same object may include determining 606 that features having a consistent location and/or shape are present in the N frames and exhibit a change in location between frames that is consistent with a real trajectory, e.g. having a speed, acceleration, turning radius, etc. corresponding to a real object.

If the conditions of steps 604 and 606 are found to be met, a tracklet may be created 608 that includes the data, or values derived from the data, included in the features of the N contiguous frames. If not, the method 600 may end without creating a tracklet for the feature. A tracklet may be created in subsequent iterations of the method 600 provided the conditions of one or both of steps 604 and 606 are subsequently met.

Figure 7:
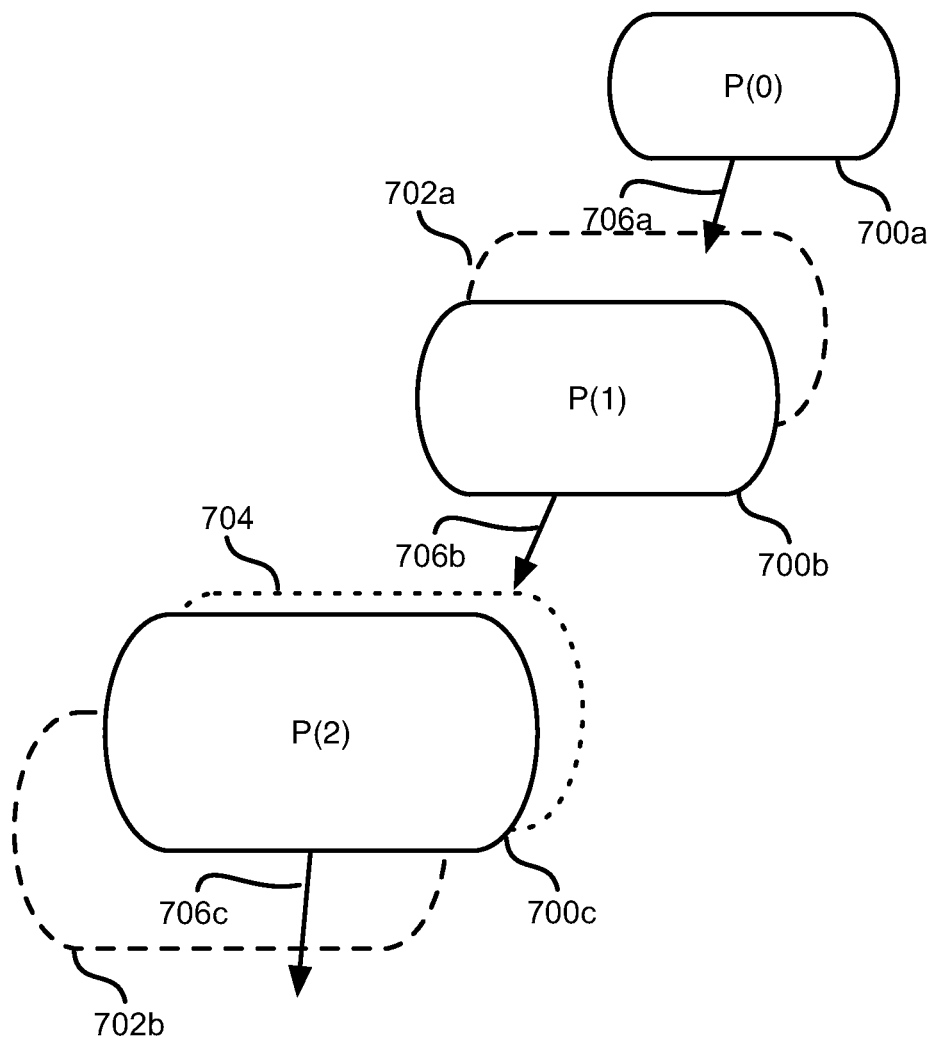
FIG. 7 is a diagram illustrating sensor readings for updating a tracklet in accordance with an embodiment of the present invention.

Referring to FIG. 7, the illustrated diagram illustrates the change in a tracklet over time. Features 700*a*-700*c* represent features detected in the output of one sensor, features 702*a*, 702*b* represent features detected in the output of a second sensor, and feature 704 represents a feature detected in the output of a third sensor. The first, second, and third sensors may be different types of sensors with different sensing modalities, e.g. a lens-based camera, LIDAR sensor, RADAR sensor, ultrasonic sensor and the like.

Upon detecting feature 700*a*, a tracklet may be created, such as in response to executing the method 600. An initial probability P(0) is calculated indicating a confidence that the object in fact exists based on the feature 700*a* being found in the sensor output.

At a subsequent point in time, features 700*b* and 702*a* are detected and determined to belong to the same tracklet as feature 700*a*, such as due to lying on a trajectory 706*a* for feature 700*a*, having a within-tolerance distance to feature 700*a*, having a same extent and/or shape as the feature 700*a*, or some other criteria.

An updated trajectory 706*b* for the tracklet may be calculated based on the feature 700*a* and the newer features 700*b*, 702*a*. As noted above, the trajectory 706*b* may be calculated by Kalman filtering these features 700*a*, 700*b*, 702*a*.

An updated probability P(1) is calculated that indicates the confidence that the tracklet represents a real object in view of the features 700*a*, 700*b*, and 702*a*. As noted above, this may include performing a Bayesian probability update based on the features 700*b*, 702*a*.

At a later point in time, features 700*c*, 702*b*, and 704 are detected and associated with the tracklet. Another updated trajectory 706*c* is calculated as described above and an updated probability P(2) is calculated based on the most recent features 700*c*, 702*b*, 704. At some point, the probability, P(2) becomes large enough that the object is determined to be real. Accordingly, the vehicle controller 102 may perform obstacle avoidance with respect to the object.

In the example of FIG. 7, when an object is first detected at a large distance away, there are few features corresponding to the object. As the object draws closer, more and more features are detected and used to update the tracklet. The probability therefore aggregates the effect of these features over time such that as the object becomes a potential danger, the probability will exceed the threshold and obstacle avoidance can be performed.

In contrast, features that are not associated to a tracklet along with many features over time from multiple sensors will not exceed the threshold and will be ignored. This will include features corresponding to objects that do not approach the vehicle 300*a* and detected features that are the result of sensor noise rather than an actual object.

As is apparent form FIGS. 5-7, the statistical method shown attempts to track the location and possibly the velocity of individual objects. Accordingly, the annotations of step 308 for methods 300*a*, 300*b* may include annotation with the actual location of obstacles in the scenario. These locations may then be compared with the tracklet locations to determine whether the tracklet corresponds to an obstacle in the scenario or is a false positive and whether an obstacle was not detected at all, i.e., a false negative.

As described above, a statistical model is used at step 512 to update the tracklet probability. This model may be adjusted based on the comparison of step 312 of the methods 300*a*, 300*b*. For example, for a particular sensor, the statistical model may include a function defining an amount by which the probability is increased in response to a detection. Parameters defining this function may be adjusted to reduce false positives and false negatives. For example, for the same set of simulated sensor outputs, the methods of FIGS. 5-6 may be executed repeatedly with the parameters of the probability update functions for the various sensors being adjusted at each iteration in order to reduce the number of false positives and false negatives.

Figure 8:
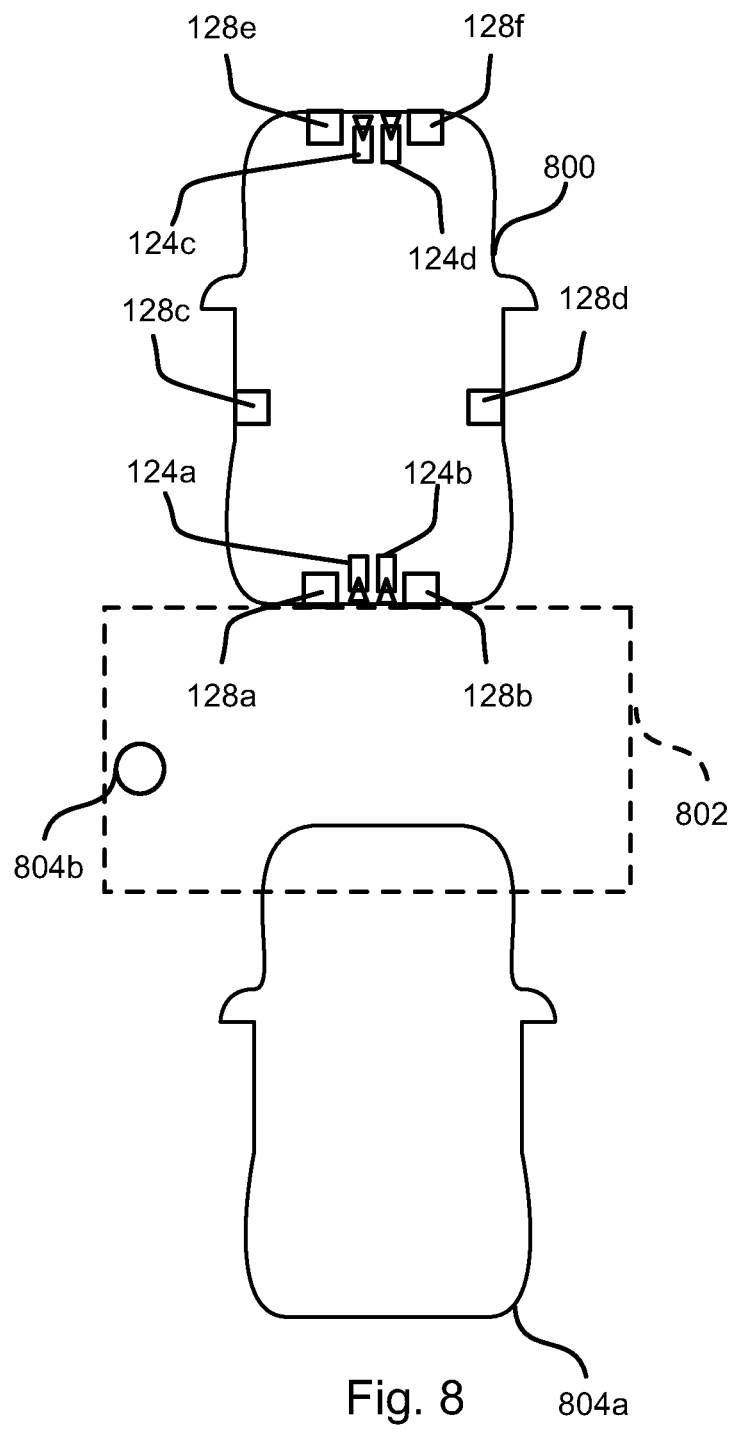
FIG. 8 is an illustration of a scenario for detecting obstacles using a probabilistic model in accordance with an embodiment of the present invention.

FIG. 8 illustrates another scenario in which a vehicle 800 housing the controller 122 may have rearward facing sensors 128*a*, 128*b*, such as a LIDAR, RADAR, ultrasonic, or other sensors. The vehicle 800 may further include rearward facing cameras 124*a*, 124*b*. The rearward facing cameras 124*a*, 124*b* may implement binocular vision such that the three-dimensional location of objects may be determined from the outputs of the cameras 124*a*, 124*b*. The outputs of the sensors 128*a*, 128*b* may also be in the form of three-dimensional data, such as in the form of a point cloud wherein each point indicating a location at which material was detected. Other sensors 128*c*, 128*d* may detect objects in lateral regions and sensors 128*e*, 128*f* may detect obstacles in forward regions of the vehicle 800. Forward facing cameras 124*c*, 124*d* may be also be used for forward obstacle detection. Although the systems and methods disclosed herein are particularly useful for improving safety while reversing, they may also be applied to forward movement with forward facing cameras and other sensors.

For the methods 300*a*, 300*b*, the scenario illustrated in FIG. 8 may be modeled with the vehicle 800 and its corresponding sensors being replaced with models and perception of the scenario simulated according to models of the scenario. Hereinafter, references to the vehicle 800 and perception by the sensors 124*a*-124*d*, 128*a*-128*e* shall be understood to refer to models of these components when performed in the context of the methods 300*a*, 300*b*.

The methods disclosed herein are particularly concerned with a zone of interest 802 behind the vehicle 800. As is apparent, the zone of interest 802 extends longitudinally rearward of the vehicle 800 and may also extend laterally on either side of the vehicle 800. At least some of the imaging devices 124*a*-124*d* and at least some of the other sensors 128*a*-128*f* have at least this zone of interest 802 in their fields of view. In some embodiments, the fields of view of the imaging devices 124*a*, 124*b* and other rearward facing sensors 128*a*, 128*b* may extend further than this zone of interest 802. In such embodiments, features in sensor outputs indicating a location outside of the zone of interest 802 may be ignored or have a reduced impact on the probability that an object is located in the zone of interest 802 as compared to features located in the zone of interest 302.

Objects 804*a*, 804*b* located within the zone of interest 802 are detected by the imaging devices 124*a*, 124*b* and other sensors 128*a*, 128*b* and braking of the vehicle 800 may be invoked. The method by which objects 804*a*, 804*b* are detected is described below with respect to FIG. 9.

Figure 9:
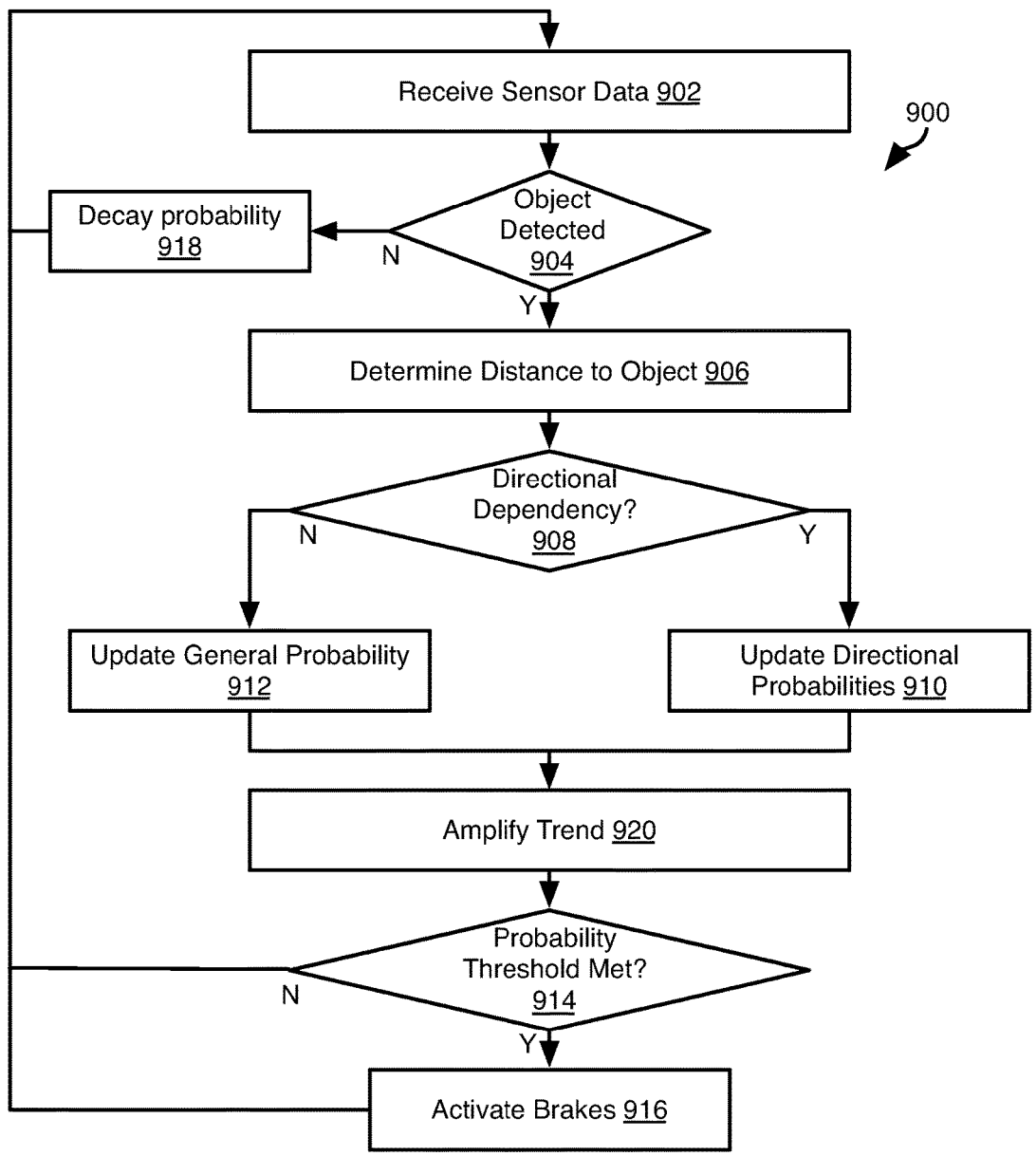
FIG. 9 is a process flow diagram of a method for detecting obstacles using a probabilistic model in accordance with an embodiment of the present invention.

Referring to FIG. 9 the illustrated method 900 may include receiving outputs of the imaging devices 124*a*, 124*b* and other sensors 126*a*, 126*b*. The method 900 may be executed by the server system 102 in the context of the methods 300*a*, 300*b* or by the vehicle controller 122 when used for actual obstacle detection.

The method 900 may be performed for outputs from all of the imaging devices 124*a*, 124*b* and other sensors 126*a*, 126*b* such that any feature in the output of any sensor may contribute to an increase in the probability that an object is present within the zone of interest 802. In particular, a single probability metric may be updated based on detecting different objects by different sensors.

The method 900 may include receiving 902 sensor data. The method 900 may be executed with respect to each frame of sensor data received from the imaging devices 124*a*, 124*b* and the other sensors 126*a*, 126*b* (hereinafter "sensing devices"). The method 900 may process frames of sensor data from multiple sensing devices individually or simultaneously. Where the method 900 is executed in the context of the methods 300*a*, 300*b*, "sensing devices" shall refer to the models of sensing devices and the sensor data or sensor outputs shall refer to simulated sensor outputs simulating perception of the scenario.

The method 900 may include evaluating 904 whether an object is detected in the sensor output, which may be a pair of binocular images, a point cloud, detected radar or ultrasound reflections, or any other sensor output. The manner in which objects are detected in these outputs may include using any method known in the art for detecting objects using binocular vision, RADAR sensor, LIDAR sensor, ultrasonic sensor, or other type of sensor for detecting the environment of a vehicle. Detecting 904 an object may or may not be accurate, inasmuch as sensors may have false positives. Accordingly, detecting 904 an object may include detecting a feature in the output of a sensing device that indicates a potential obstruction. Accordingly, references to detected objects herein below refer to processing of obstruction-indicating features in sensor outputs.

If an object is detected 904, then the remaining elements of the method 900 may be executed. This may include determining 906 a distance to the detected object. This may include any method known in the art for detecting the location of objects using binocular vision, RADAR sensor, LIDAR sensor, ultrasonic sensor, or other type of sensor for detecting the environment of a vehicle. In some embodiments, detecting 904 an object may inherently include determining its location such that step 906 does not include a different step.

The sensing devices may provide a location of an object in different coordinate systems or different forms, such as in the form of a time to impact. Accordingly, step 906 may include translating the locations into a common coordinate systems or a common distance metric, e.g. a longitudinal distance behind the vehicle 800 or a lateral distance from a longitudinal center line of the vehicle 800.

Each of the sensing devices may have a variance indicating an uncertainty in one or both of the distance to an object determined from an output of the sensor and whether an object is in fact present when a feature in the sensor output indicates that an object is present.

In some instances, this variance may be directional, i.e. a sensor may more accurately sense a longitudinal location of an object than the lateral location of an object, or vice versa. Accordingly, a sensor may have a longitudinal variance and a lateral variance. If a sensor from which the output of step 902 was received is found 908 to have a directionally dependent variance, the method 900 may include updating 910 directional probabilities.

Specifically, for each output found 904 to indicate presence of an object, a probability may be updated such that the probability increases each time the sensing devices senses an object. In some embodiments, the probability is updated according to a function that increases with both the number of times an output indicates an object is present and a distance to a sensed object indicated by that output. In some embodiments, the probability may be updated according to a function of all of the following parameters: (a) the number of times sensor outputs indicate objects, (b) the distance to the sensed objects, and (c) a variance of the sensor that indicates the presence of the sensed objects. Specifically, the amount by which the probability increases in response to detecting 904 an object will be greater with smaller distance to the object and with smaller variance in the sensor that detected the object.

Where the probability is zero, i.e. no object has been previously detected, the probability may be calculated based on these parameters using a Bayesian probability function. Where the probability is non-zero, the probability may be updated in response to each detection 904 of an object according to these parameters using a Bayesian probability update technique.

In the case of directionally dependent variance, directional probabilities, e.g., a longitudinal probability and a lateral probability, may be updated 910 or initially calculated, where the longitudinal probability is calculated according to the distance and longitudinal variance of the sensing device and the lateral probability is calculated according to the distance and lateral variance of the sensing device.

Where a sensing device from which the sensor data of step 902 was received does not have a directional dependency, a single general probability may be updated 912 using the same parameters and in the same manner as for the directional probabilities. Alternatively, step 912 may include updating 912 the directional probabilities using the directionally-independent variance of the sensing device 104*a*, 104*b*, 106*a*, 106*b* to update both directional probabilities.

The method 900 may include evaluating 914 whether a probability threshold has been met. This may include evaluating one or more of the general probability or of the directional probabilities exceeds some confidence threshold, e.g. at least 70%, 80%, 90%, or some other minimum percentage of certainty.

If so, then actions may be taken 916 by the controller such as automatically activating brakes, reducing or stopping acceleration, generating a perceptible alert to a driver, autonomously navigating the vehicle 300 around detected 904 objects, or any other action to prevent or reduce harm caused by impact.

In practice, the method 900 will result in an increase in probability for sensed objects that are far away from the vehicle. The probability will increase rapidly as an object approaches both because (a) distance is a factor in computing the probability and it is becoming smaller, (b) more sensors will detect the object, and (c) the object will have been detected an ever increasing number of times as it moves closer to the vehicle and the probability increases each time an object is detected. The probability may be calculated in such a way that presence of the object in the zone of interest 802 will have a sufficient large effect on the probability that the threshold of step 916 will be met.

In some embodiments, the probability (general and directional) may be decayed 918 in the absence of detection 904 of an object in the output of a sensor. For example, if no objects are detected in the outputs of any sensors for one or more data frames, the probability may be decayed 918, such as according to a decaying exponential function or according to a Bayesian probability update wherein the additional information is an absence of data confirming the probability indicated by the statistical model. The amount of decay may increase with an amount of time that passes between a data frame of any sensor that indicates an object and a current time at which the method 900 is executed.

In many instances objects may be transitorily present in or near the zone of interest 302. Likewise, sensor noise may result in transient perception of objects in the output of a sensing device 104*a*, 104*b*. Accordingly, not all perceived objects would require that braking or other actions be taken. Decaying 918 the probability may reduce the impact of these transitory detections.

In some embodiments, the impact of transitory detections may be further reduced, and the impact of increasing probability may be amplified by amplifying 920 trends in the probability (general or directional). For example, if the probability is decaying over time, tuning parameters may be specified and the probability may be caused to decay more according to a function of the rate of decay in the probability and the tuning parameters.

Likewise, amplifying 920 trends may include increasing the probability as a function of the tuning parameters and a rate of increase of the probability over time, i.e. in response to detection 904 of objects for two or more iterations of the method 900. In this manner, the impact of objects that are non-transitory and are causing increase in the probability (general or directional) will be increased, ensuring that the probability will quickly reach the threshold that will invoke action, such as activating 916 the brakes.

Where the method 900 is executed in the context of a simulation according to the methods 300*a*, 300*b*, step 916 may be omitted or replaced with simulated braking, i.e., simulating braking of the model of the vehicle 800 in a scenario. Inasmuch as the output of the method 900 is a determination that the zone of interest 802 is occupied, the annotations of step 308 may therefore include for a given time step whether the zone of interest 802 is occupied in the scenario. Accordingly, the determination of step 914 may be compared to the annotations to identify false positives (zone is not occupied in the scenario but the threshold is found 914 to be met) and false negatives (zone is occupied but the threshold is not found 914 to be met).

As for other embodiments disclosed herein, parameters defining probability update functions of steps 912, 910 or the amplification 920 and decay 918 of probabilities may be adjusted. For example, the same sensor outputs may be processed repeatedly with the parameters being adjusted at each iteration in order to decrease the number of false positives and false negatives.

Figure 10:
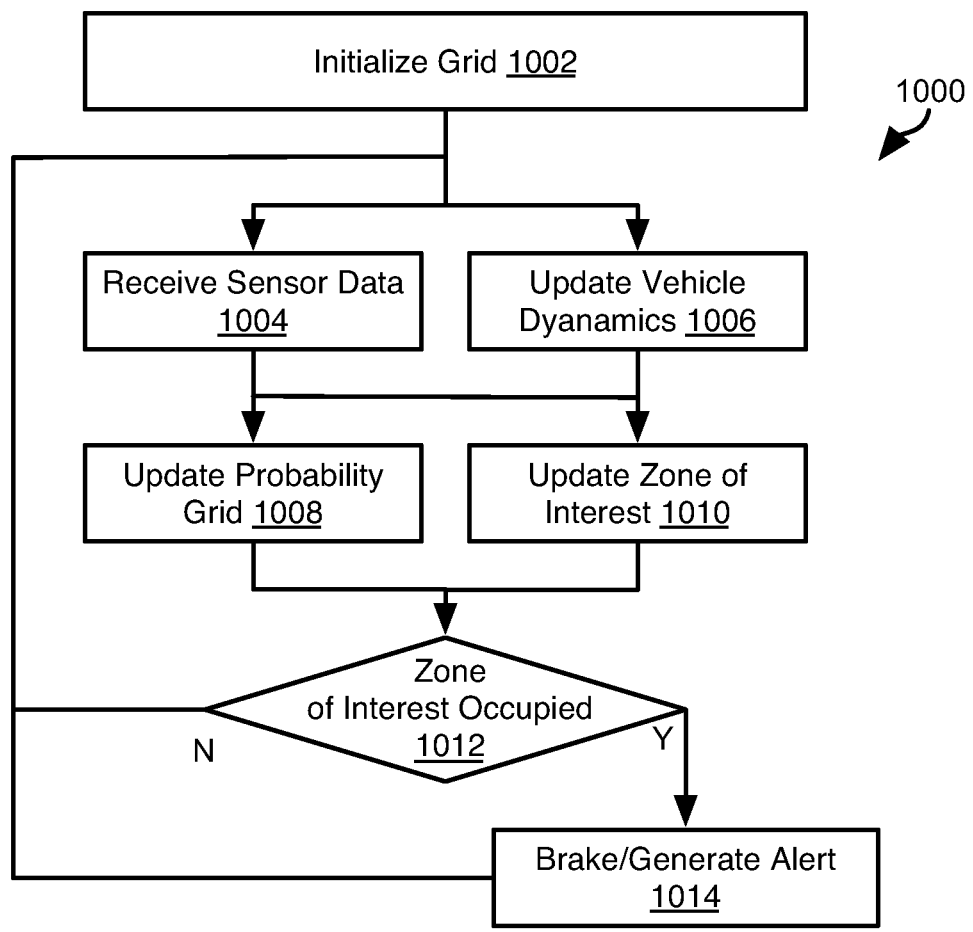
FIG. 10 is a process flow diagram of a method for detecting obstacles using a grid-based probabilistic model in accordance with an embodiment of the present invention.

Referring to FIG. 10, the illustrated method 1000 provides a grid-based approach for identifying obstacles. The method 1000 may be executed by the server system 102 in the context of the methods 300*a*, 300*b* or by the vehicle controller 122 when used for actual obstacle detection. The method 1000 is described below with respect to the example scenario of FIG. 8.

Figure 11:
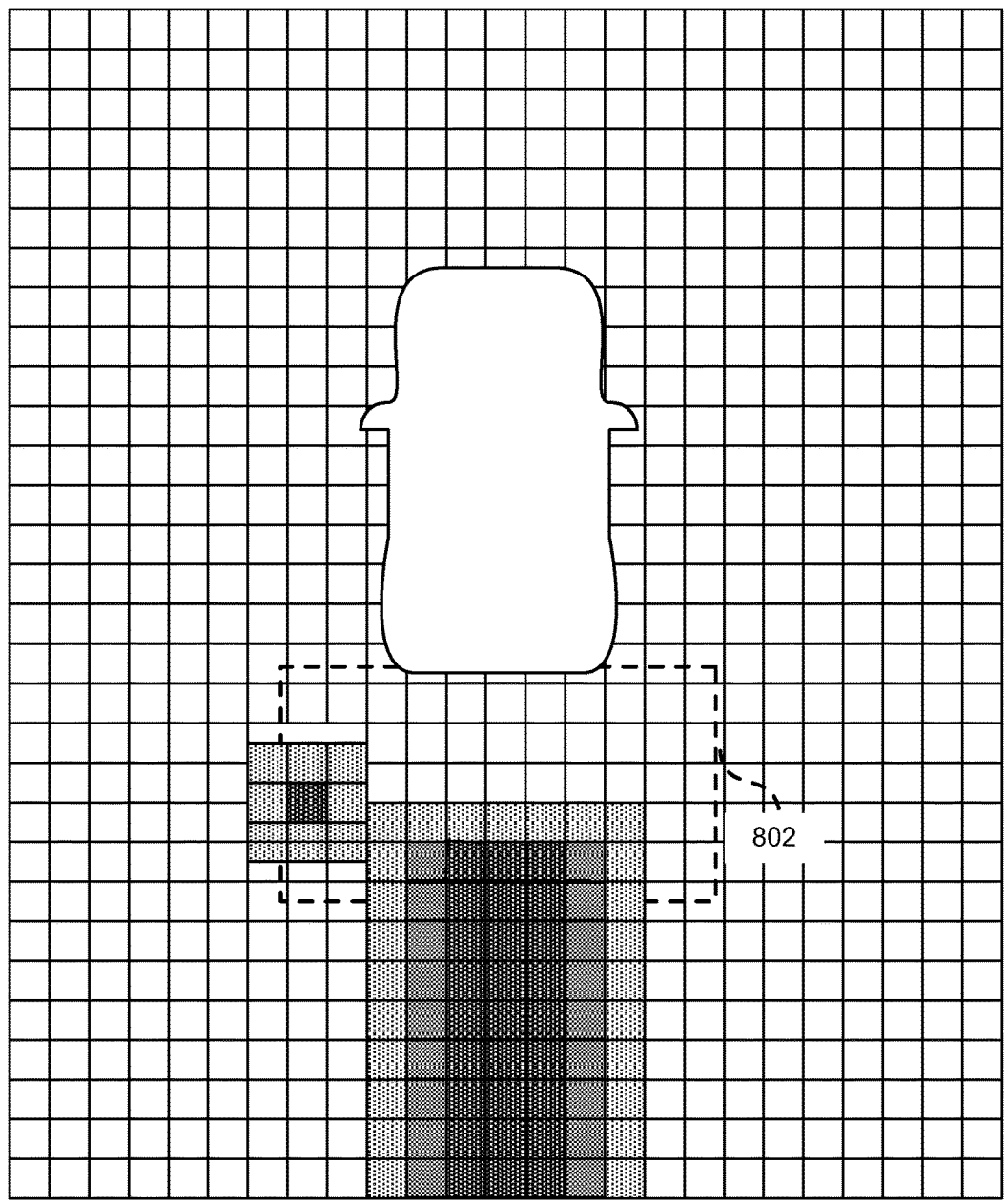
FIG. 11 illustrates perception of a scenario using the grid-based probabilistic model in accordance with an embodiment of the present invention.

The method 1000 may include initializing a gird. As shown in FIG. 11, the region surrounding the vehicle may be divided into grid squares each having a probability of occupancy associated therewith. In the absence of any sensor data, the grid may be initialized 1002 such that the probability of occupancy of each grid square is 50%.

The method 1000 may include receiving 1004 sensor data, which is simulated sensor data in the context of the methods 300*a*, 300*b* or actual sensor data when in use in an actual vehicle. Hereinafter, the references to "sensor data" and "sensors" shall be understood to refer to actual sensor data from sensors 124*a*-14*d*, 1128*a*-128*f* when the method 500 is performed by a vehicle controller 122. "Sensor data" and "sensors" shall be understood to refer to simulated sensor data and models of sensors perceiving a scenario where the method 500 is performed in the context of either of the methods 300*a*, 300*b*.

The method 1000 may further include updating 1006 vehicle dynamics 1006. This may include receiving data from vehicle sensors and one or more accelerometers to determine the velocity of the vehicle and possibly other values such as yaw rate, steering wheel angle, steered road wheel angle, or the like. The manner in which the dynamics of the vehicle are determined from sensor and/or accelerometer data may be according to any method known in the art.

The method 1000 may further include updating 1008 the probability grid according to one or both of the sensor data of step 1004 and the vehicle dynamics of step 1006. Some sensor data provides a three-dimensional (3D) point cloud, such as LIDAR data or data obtained from binocular vision. Accordingly, the grid square overlapping one or more coordinates corresponding to a solid object may be updated at step 1008. In particular, the probability of occupancy may be increased each time a coordinate corresponding to a solid object overlaps the grid square.

In some embodiments, a sensor may have a variance associated therewith. Accordingly, grid squares that do not overlap a coordinate corresponding to a solid object may also be updated such that their probability increases based on this variance. For example, for a coordinate x0, y0, a distribution function f(x-x0, y-y0) may be defined that indicates the probable actual location of an object detected to be at point x0, y0. Accordingly, where this function is non-zero or above a threshold for values of x and y within the bounds of a gird square, the probability of that grid square may be updated.

In some embodiments, a sensor has a field of view and can indicate presence of an object in that field of view but does not provide a coordinate. Accordingly, a function f(R,theta) may indicate the probability of an object being present at a given radius and angle relative to the sensor when the sensor indicates the object is detected. Accordingly, for a sensor output indicating occupancy of the field of view of the sensor, grid squares overlapping this field of view may have the probability of occupancy thereof increased as a function of the value of f(R, theta), where R and theta correspond to that grid square location.

Updating 1008 the probabilities of the grid squares may further include decaying the probabilities of one or more grid squares that are not increased due to a sensor output as described above. For example, for each time step in which the probability a grid square is not increased, the probability thereof may be decreased according to a decay function.

FIG. 11 shows a resulting grid following perception of the scenario of FIG. 8. The shading of each grid square indicates the probability of occupancy of that grid square. Accordingly, grid squares overlapping and/or surrounding the locations of obstacles 804*a*, 804*b* are shown as shaded and having non-zero probabilities.

The method 1000 may further include updating 1010 the zone of interest 802. In particular, the faster the vehicle 800 is moving, the larger the zone 802 will be inasmuch as the reaction time required to stop or change direction is increased. In some embodiments, the zone 802 may be arcuate, indicating an arcuate path of the vehicle as determined by some or all of the yaw rate, steering wheel angle, and steered road wheel angle. Accordingly, the zone 802 may be modified at step 1010 to correspond to current values of some or all of the yaw rate, steering wheel angle, and steered road wheel angle.

The method 1000 may further include evaluating 1012 whether the probabilities of any of the grid squares in the zone of interest 802 exceed a threshold probability. As shown in FIG. 11, for example, perception of the scenario of FIG. 8 results in squares corresponding to the locations of obstacles 804*a*, 804*b* having probabilities exceeding the threshold.

If at least one grid square in the zone of interest has a probability exceeding the threshold condition, the one or more actions may be taken such as braking 1014, generating an audible or visible alert, or steering to avoid the obstacle.

Where the method 1000 is executed in the context of the methods 300a, 300b, the annotations of step 308 may indicate the actual occupancy of each grid square. Accordingly, the probabilities of the grid squares calculated according to the simulated sensor outputs may be compared to the annotations. Grid squares having an above threshold probability at a given time step that for which they are not annotated as being occupied for that time step are false positives. Grid squares having a below threshold probability for a time step for which they are annotated as being occupied as false positives.

Various parameters may be experimentally adjusted to decrease the number of false positives and false negatives. In particular, the probability functions of sensors and the probability update functions used at step 1008 for a give value of the probability function for a given grid square may be adjusted in order to reduce the number of false positives and false negatives.

In the above disclosure, reference has been made to the accompanying drawings, which form a part hereof, and in which is shown by way of illustration specific implementations in which the disclosure may be practiced. It is understood that other implementations may be utilized and structural changes may be made without departing from the scope of the present disclosure. References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Implementations of the systems, devices, and methods disclosed herein may comprise or utilize a special purpose or general-purpose computer including computer hardware, such as, for example, one or more processors and system memory, as discussed herein. Implementations within the scope of the present disclosure may also include physical and other computer-readable media for carrying or storing computer-executable instructions and/or data structures. Such computer-readable media can be any available media that can be accessed by a general purpose or special purpose computer system. Computer-readable media that store computer-executable instructions are computer storage media (devices). Computer-readable media that carry computer-executable instructions are transmission media. Thus, by way of example, and not limitation, implementations of the disclosure can comprise at least two distinctly different kinds of computer-readable media: computer storage media (devices) and transmission media.

Computer storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

An implementation of the devices, systems, and methods disclosed herein may communicate over a computer network. A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links, which can be used to carry desired program code means in the form of computer-executable instructions or data structures and which can be accessed by a general purpose or special purpose computer. Combinations of the above should also be included within the scope of computer-readable media.

Computer-executable instructions comprise, for example, instructions and data which, when executed at a processor, cause a general purpose computer, special purpose computer, or special purpose processing device to perform a certain function or group of functions. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the disclosure may be practiced in network computing environments with many types of computer system configurations, including, an in-dash vehicle computer, personal computers, desktop computers, laptop computers, message processors, handheld devices, multi-processor systems, microprocessor-based or programmable consumer electronics, network PCs, minicomputers, mainframe computers, mobile telephones, PDAs, tablets, pagers, routers, switches, various storage devices, and the like. The disclosure may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Further, where appropriate, functions described herein can be performed in one or more of: hardware, software, firmware, digital components, or analog components. For example, one or more application specific integrated circuits (ASICs) can be programmed to carry out one or more of the systems and procedures described herein. Certain terms are used throughout the description and claims to refer to particular system components. As one skilled in the art will appreciate, components may be referred to by different names. This document does not intend to distinguish between components that differ in name, but not function.

It should be noted that the sensor embodiments discussed above may comprise computer hardware, software, firmware, or any combination thereof to perform at least a portion of their functions. For example, a sensor may include computer code configured to be executed in one or more processors, and may include hardware logic/electrical circuitry controlled by the computer code. These example devices are provided herein purposes of illustration, and are not intended to be limiting. Embodiments of the present disclosure may be implemented in further types of devices, as would be known to persons skilled in the relevant art(s).

At least some embodiments of the disclosure have been directed to computer program products comprising such logic (e.g., in the form of software) stored on any computer useable medium. Such software, when executed in one or more data processing devices, causes a device to operate as described herein.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments, but should be defined only in accordance with the following claims and their equivalents. The foregoing description has been presented for the purposes of illustration and description. It is not intended to be exhaustive or to limit the disclosure to the precise form disclosed. Many modifications and variations are possible in light of the above teaching. Further, it should be noted that any or all of the aforementioned alternate implementations may be used in any combination desired to form additional hybrid implementations of the disclosure.

The invention claimed is:

1. A method comprising, by a computer system:
   simulating perception of a 3D model by one or more sensors to obtain one or more sensor outputs such that the one or more sensor outputs simulate sensor noise;
   annotating the one or more sensor outputs according to locations of obstacles in the 3D model; and
   at least one of training and testing a model according to the one or more sensor outputs and the annotations;
   wherein simulating perception of the 3D model by the one or more sensors to obtain the one or more sensor outputs such that the one or more sensor outputs simulate the sensor noise comprises:
      identifying a location of an obstacle in the 3D model;
      generating one or more sensor outputs corresponding to the location of the obstacle relative to locations of the one or more sensors in the 3D model; and
      adding noise to the one or more sensor outputs according to one or more models of variances of the one or more sensors.

2. The method of claim 1, wherein the one or more sensors are defined with respect to model of a subject vehicle;
   wherein the one or more sensors are defined by one or more camera locations; and
   wherein simulating perception of the 3D model by the one or more sensors comprises simulating detection of images of the 3D model from the one or more camera locations.

3. The method of claim 1, wherein the one or more sensors are defined with respect to a model of a subject vehicle;
   wherein the one or more sensors are defined by a RADAR (radio detection and ranging) sensor location; and
   wherein simulating perception of the 3D model by the one or more sensors comprises simulating a RADAR sensor output according to perception of the 3D model from the RADAR sensor location.

4. The method of claim 1, wherein the one or more sensors are defined with respect to a model of a subject vehicle;
   wherein the one or more sensors are defined by a LIDAR (light detection and ranging) sensor location; and
   wherein simulating perception of the 3D model by the one or more sensors comprises simulating a LIDAR sensor output according to perception of the 3D model from the LIDAR sensor location.

5. The method of claim 1, wherein the 3D model further includes a definition of velocities for one or more adjacent vehicles and a velocity of a subject vehicle defining one or more locations of the one or more sensors.

6. The method of claim 1, wherein annotating the one or more sensor outputs according to the locations of obstacles in the 3D model comprises annotating the one or more sensor outputs with the locations of the obstacles in the 3D model; and
   wherein at least one of training and testing the model according to the one or more sensor outputs and the annotations comprises testing a statistical model that tracks the obstacles and assigns a probability to an expected location for each obstacle of the obstacles.

7. The method of claim 1, wherein annotating the one or more sensor outputs according to the locations of obstacles in the 3D model comprises annotating the one or more sensor outputs with an occupancy status of a region adjacent a model of a subject vehicle according to the locations of the obstacles in the 3D model;
   wherein at least one of training and testing the model according to the one or more sensor outputs and the annotations comprises testing a statistical model that updates a probability of occupancy of the region according to the one or more sensor outputs.

8. The method of claim 1, wherein annotating the one or more sensor outputs according to the locations of obstacles in the 3D model comprises annotating the one or more sensor outputs with a grid such that each square of the grid is annotated with whether the each square is occupied by one of the obstacles;
   wherein at least one of training and testing the model according to the one or more sensor outputs and the annotations the statistical model comprises testing a statistical model that updates a probability of occupancy of squares of the grid surrounding a vehicle according to the one or more sensor outputs.

9. A system comprising one or more processing devices and one or more memory devices operably coupled to the one or more memory devices, the one or more memory devices storing executable code effective to cause the one or more processing devices to:
   define a three-dimensional (3D) model including a subject vehicle defining one or more sensor locations and one or more obstacles;
   simulate perception of the 3D model by one or more sensors at the one or more sensor locations to obtain one or more sensor outputs such that the one or more sensor outputs simulate sensor noise;
   annotate the one or more sensor outputs according to locations of obstacles in the 3D model; and
   at least one of train and test a model according to the one or more sensor outputs and the annotations;
   wherein the executable code is further effective to cause the one or more processors to simulate perception of the 3D model by the one or more sensors by simulating a RADAR (radio detection and ranging) sensor output according to perception of the 3D model from the one or more sensor locations; and
   wherein the executable code is further effective to cause the one or more processors to simulate perception of the 3D model by the one or more sensors in sufficient detail that the sensor noise results from multiple simulated reflections of a simulated electromagnetic wave propagated from a simulated RADAR sensor.

10. The system of claim 9, wherein the 3D model further includes definition of velocities for one or more adjacent vehicles and a velocity of a subject vehicle defining one or more locations of the one or more sensors.

11. The system of claim 9, wherein the executable code is further effective to cause the one or more processors to:
   annotate the one or more sensor outputs according to the locations of obstacles in the 3D model by annotating the one or more sensor outputs with the locations of the obstacles in the 3D model; and
   at least one of train and test the model according to the one or more sensor outputs and the annotations by testing a statistical model that tracks the obstacles and assigns a probability to an expected location for each obstacle of the obstacles.

12. The system of claim 9, wherein the executable code is further effective to cause the one or more processors to:
   annotate the one or more sensor outputs according to the locations of obstacles in the 3D model by annotating the one or more sensor outputs with an occupancy status of a region adjacent a model of a subject vehicle according to the locations of the obstacles in the 3D model;
   at least one of train and test the model according to the one or more sensor outputs and the annotations by testing a statistical model that updates a probability of occupancy of the region according to the one or more sensor outputs.

13. The system of claim 9, wherein the executable code is further effective to cause the one or more processors to:
   annotate the one or more sensor outputs according to the locations of obstacles in the 3D model by annotating the one or more sensor outputs with a grid such that each square of the grid is annotated with whether the each square is occupied by one of the obstacles;
   at least one of train and test the model according to the one or more sensor outputs and the annotations by testing a statistical model that updates a probability of occupancy of squares of the grid surrounding a vehicle according to the one or more sensor outputs.

* * * * *